(12) United States Patent
McGimpsey

(10) Patent No.: US 8,076,125 B2
(45) Date of Patent: Dec. 13, 2011

(54) IMAGEWISE PATTERNING OF FILMS AND DEVICES COMPRISING THE SAME

(75) Inventor: W. Grant McGimpsey, Boylston, MA (US)

(73) Assignee: Worcester Polytechnic Institute, Worcester, MA (US)

( * ) Notice: Subject to any disclaimer, the term of this patent is extended or adjusted under 35 U.S.C. 154(b) by 0 days.

(21) Appl. No.: 12/093,519

(22) PCT Filed: Nov. 15, 2006

(86) PCT No.: PCT/US2006/044460
§ 371 (c)(1),
(2), (4) Date: Sep. 9, 2008

(87) PCT Pub. No.: WO2007/059265
PCT Pub. Date: May 24, 2007

(65) Prior Publication Data
US 2009/0220381 A1    Sep. 3, 2009

Related U.S. Application Data

(60) Provisional application No. 60/737,328, filed on Nov. 15, 2005.

(51) Int. Cl.
*C12M 1/00*    (2006.01)

(52) U.S. Cl. ............... 435/285.1; 427/2.12; 427/2.13; 427/457; 436/518

(58) Field of Classification Search .................... None
See application file for complete search history.

(56) References Cited

U.S. PATENT DOCUMENTS

| | | | | |
|---|---|---|---|---|
| 5,136,033 | A * | 8/1992 | Masilamani et al. | 540/468 |
| 6,489,078 | B1 * | 12/2002 | Van Damme et al. | 430/170 |
| 2001/0055812 | A1 * | 12/2001 | Mian et al. | 436/45 |
| 2006/0094198 | A1 * | 5/2006 | Klauk et al. | 438/382 |
| 2006/0138083 | A1 * | 6/2006 | Ryan et al. | 216/62 |

OTHER PUBLICATIONS

Hoeppener et al., Metal nanoparticles, nanowires, and contact electrodes self-assembled on patterned monolayer templates—a bottom-up chemical approach, 2002, Adv. Mater., 14(15): pp. 1036-1041.*

* cited by examiner

*Primary Examiner* — N. C. Yang
(74) *Attorney, Agent, or Firm* — Nelson Mullins Riley & Scarborough LLP; Anthony A. Laurentano

(57) ABSTRACT

The present invention is directed, at least in part, to methods for imagewise patterning of a surface. Such patterned surfaces can be used, e.g., in microfluidic devices. Accordingly, the present invention is also directed, at least in part, to nano-patterned devices which include a microchannel structure and methods for forming such devices.

12 Claims, 20 Drawing Sheets

2-nitrobenzyl undec-10-enoate 11-(2-nitrobenzyloxy)-11-oxoundecanoic acid 2-nitrobenzyl 11-bromoundecanoate Di-tert-butyl 5-(11-(2-nitrobenzyloxy)-11-oxoundecyloxy)isophthalate 5-(11-(2-nitrobenzyloxy)-11-oxoundecyloxy)isophthalic acid 100μm ptop in the invention.

IMAGEWISE PATTERNING OF FILMS AND DEVICES COMPRISING THE SAME

RELATED APPLICATIONS

This application is related and claims priority to U.S. Provisional Application Ser. No. 60/737,328, filed Nov. 15, 2005, the contents of which are hereby incorporated herein in their entirety by this reference.

GOVERNMENT SUPPORT

This work was supported by the National Science Foundation (NIRI DMI 0210258). The government has certain rights in the invention.

BACKGROUND

The field of microfluidics has a number of emerging applications in analytical chemistry and chemical processing. One task central to the operation of microfluidic devices is the ability to move small volumes of fluid through microchannels and to control fluid flow. Traditional approaches to microfluidic device fabrication employ microfabrication or micromachining of substrates to produce three-dimensional structures to channel fluid flow. However, fabrication of such structures as valves, mixers and even chambers becomes increasingly difficult as the scale of the device decreases.

In addition, fluid transport and handling at sub-millimeter scales is distinctly different from such transport at larger scales. The large surface forces, high shear and extensional rates (e.g., low Reynolds number and high Weissenberg number), arising between the fluid and the microfluidic channels can make approaches and structures useful at larger scales useless or even inoperable at microfluidic scales. For example, as the size of the fluid conduits decrease it becomes increasingly harder to pump fluid by pressure. Surface-tension-driven actuation is one approach for handling liquids on sub-millimeter and smaller scale, but control of surface wettability can be problematic at these scales.

In addition, with decreasing scale, pumps and valves with moving parts become less attractive from an economic perspective. To this extent, functionalization of surfaces with covalently bound molecules has been attempted. However, such approaches may simply shift the primary determinant of device cost from the micromachining step to the synthesis of the covalently bound molecules and their proper attachment to the surface.

Another area of application is in the field of point-of-care (POC) analyte sensors, e.g., blood electrolyte sensors. Traditionally, most hospital electrolyte tests are performed in large, multiple-analyte analyzers in a chemistry or medical laboratory. Vials of blood are drawn from the patient for sampling, and hours, and even days, may pass before the caregiver receives the results. Various technologies have been proposed to provide a POC analyte sensor, but ultimately, reliability of sensor data is important, if not critical, if decisions are to be made without the use of traditional laboratory tests.

For example, electrochemical sensors using ion-selective electrode technology have been tried as POC electrolyte sensors. One example of an ion-selective electrode POC sensor is the i-STAT system, available from the i-STAT Corporation. The i-STAT system utilizes a blood sample that is drawn from the patient and injected into a cartridge including microfabricated, ion-selective electrodes, a calibration fluid pouch, and plastic structures for directing fluid flow and storing waste. The fluid pouch, containing known concentrations of the analytes, is punctured at the onset of a test, and the calibration fluid passes over the sensors, allowing a one-point calibration. The fluid is then flushed into the waste container and the blood sample is drawn in for testing.

Interferants, especially in the measurement of analyte concentrations in biological samples, can render unreliable analyte concentration measurements. For example, many glucose meters intended for home use are susceptible to interference from redox active materials such as vitamin C. The list of potential interferants in analyte concentration measurements of biological samples is long, and includes ions, biochemicals, proteins, cells and cellular debris. Accordingly, the reliability of concentration measurements made using traditional microfluidic sensors can be in question. Moreover, traditional microfluidic sensors do not provide, and often cannot provide, an indication of whether their individual measurements are in error. As a result, physicians cannot necessarily rely solely on the measurement provided by a traditional microfluidic sensor; this is a serious drawback for use of microfluidic sensors as POC sensors as a replacement for more traditional laboratory analysis of, e.g., blood samples.

In addition, some microfluidic devices require electrical power for, e.g., fluid movement or other analytical functioning. Incorporating electrical power into a microfluidic device generally involves configuring the device to interface with a, typically large, base unit (see, e.g., WO 01/14064) or batteries. Not only do such devices often involve complex circuitry and are often expensive to produce, but they can also limit the ease of transport of the device, e.g., in POC applications.

SUMMARY OF THE INVENTION

In various aspects, the present invention provides methods for imagewise patterning of surfaces. In various embodiments, such imagewise patterning is useful in fabrication of micro and nanodevices.

In various embodiments, the methods of the present invention include: (a) forming a first substantially monolayer thick film on at least a portion of the surface, wherein the first substantially monolayer thick film comprises at least one photo-labile molecule; (b) imagewise exposing at least a portion of the first substantially monolayer thick film to a first wavelength of light, such that a first irradiated portion is formed; (e) contacting at least a portion of the first irradiated portion with a first metal ion, such that a first metallic layer is formed; (d) forming a second substantially monolayer thick film on at least a portion of the metallic layer, wherein the second substantially monolayer thick film comprises at least one photo-labile molecule; (e) imagewise exposing at least a portion of one or more of the first and second substantially monolayer thick films with a second wavelength of light, such that a second irradiated portion is formed; (f) contacting at least a portion of the second irradiated portion with a second metal ion, such that a second metallic layer is formed; and (g) forming a cap layer on at least a portion of the second metallic layer.

In various embodiments, upon irradiation, the photo-labile molecule reacts to form one or more carboxylate groups, carboxylic acids, substituted carboxylate groups, or substituted carboxylic acids. In various embodiments, carboxylate groups are desired because they balance the charge of the metal. In various embodiments, the photo-labile molecule includes molecules comprising ortho-nitrobenzyl photolinkers and/or molecules comprising dithiane protected benzoin photolinkers. In various embodiments, the photo-labile molecule includes, but is not limited to 2-nitrobenzyl-11-mercaptoundecanoate, 2-nitrobenzyl-11-(trichlorosilyl)undecanoate, 2-nitrobenzyl undec-10-enoate, 11-(2-nitrobenzyloxy)-11-undecanoic acid, 2-nitrobenzyl 11-bromoundecanoate, di-tert-butyl 5-(11-(2-nitrobenzyloxy)-11-oxoundecyloxy)isophthalate, and/or 5-(11-(2-nitrobenzyloxy)-11-oxoundecyloxy)isophthalic acid.

In various embodiments, the first wavelength of light used in imagewise exposure and the second wavelength of light used in imagewise exposure are substantially the same. In various embodiments, the first wavelength of light used in imagewise exposure and the second wavelength of light used in imagewise exposure are different. Additionally, in various embodiments, the first metal ion and the second metal ion are substantially the same. In various embodiments, the first metal ion and the second metal ion are different.

It is to be understood that the methods can be used to form more than two metallic layers. For example, in various embodiments of the present invention, the methods include making films that include multiple layers, with multiple substantially monolayer thick films and multiple metallic layers. Accordingly, in various embodiments, the methods of the present invention can further include repeating steps (d) (e) and (f) one or more times prior to step (g). Such repetition can form, e.g., third, fourth, fifth, etc. . . . metallic layers and substantially monolayer thick films prior to adding a head group.

In various embodiments, the first metal ion and the second metal ion each independently include, but are not limited to Cu(II), Co(II), Fe(III), Pb(II), and/or Pb(IV).

In various embodiments, at least a portion of the cap layer comprises one or more of a photochromic molecule, a photovoltaic molecule, and/or an analyte sensing molecule. Any combinations of such classes of molecules, including the use of only one or two of the classes, are also contemplated in the present invention. Additionally, the use of molecules that have little or no functionality in the cap layer is also included.

Examples of the photochromic molecules that can be used in various embodiments include, but are not limited to, substituted or unsubstituted spiropyran molecules, substituted or unsubstituted spirooxazine molecules, dipyridyl containing molecules, 2,2'-dipyridylethylene, substituted or unsubstituted chromene molecules, substituted or unsubstituted spirodihydroindolizine molecules, and/or substituted diazine molecules. In various embodiments, photoconversion between configurations of the photochromic molecule is substantially reversible by irradiation with light. In various embodiments, the photoconversion is substantially irreversible by irradiation with light.

In various embodiments, exemplary photovoltaic molecules include, but are not limited to clromophores, pyridine, pyrene, perylene, naphthaline, anthracene, or other fused aromatics, porphyrins, substituted porphyrins, dicarboxypyridine-substituted tetraphenylporphyrin, mono-, di-, tri-, tetraphenyl porphyrins, benzoporphyrins, mono-, di-, tri-, tetraphenylbenzoporphyrins and/or phthalocyanines, photo-oxidants, rhodamine dyes, methyl viologen, substituted methylviologens, quinones, substituted quinines, photoreductants, EDTA, tertiary and secondary amines, and aromatics containing alkoxy groups. An exemplary chromophore of the present invention is 5-(pyren-1-ylmethoxy)isophthalic acid.

In various embodiments, the analyte sensing molecule comprises a fluorophore component and an ionophore component. The ionophore component can be, but is not limited to a crown ether and/or an aza crown calixarene. The fluorophore component can be, but is not limited to anthracene, 4,4-difluoro-4-boro-3a,4a-diaza-s-indacene, tetramethylrosamine, aminohodamine B, N-methyl-4-hydrazino-7-nitrobenzofuran, nicotinamide adenine dinucleotide (NAD), reduced NDA (NADH) and/or NAD phosphate (NADP).

The present invention, in various embodiments, addresses the deficiencies of the prior art by providing methods for making films, e.g., for use in microfluidic devices, which can be utilized to manipulate and analyze microfluidic sample volumes, i.e., sample volumes on the order of 1 to 1000 microliters, and, in various embodiments, sample volumes on the order of 1 to 1000 nanoliters. For example, microfluidic devices of the present invention can be used in various embodiments to manipulate and analyze microfluidic samples of water, biological fluids (such as, e.g., blood, plasma, serum, urine, saliva, sweat and tears), etc. Where the sample of interest, for example, is blood, the sample volumes only require a prick of the finger and not a blood draw to acquire a sample. Even smaller sample volumes may be obtained by suction techniques and electroactive techniques such as reverse iontophoresis. In various embodiments, the devices of the present invention can be used, e.g., as for POC blood analyte (e.g., electrolyte, glucose, etc.) testing in hospitals, clinics, physicians' offices, or patients' homes. In various embodiments, the microfluidic devices of the present invention are reusable, instead of being a disposable cartridge, helping reduce, e.g., costs associated with the disposal of biomedical waste, which creates a more cost-effective device.

In various aspects, the present invention provides a nanopatterned device, the device including a microchannel structure. In various embodiments, the microchannel structure has one or more fluid control regions; and one or more analyte sensing regions in fluid communication with the one or more fluid control regions, wherein at least one of the fluid control regions directs the flow of fluid to at least one of the analyte sensing regions. In various embodiments, the microchannel structure also includes one or more photovoltaic regions.

In various embodiments, the fluid control region is an active fluid control region, e.g., a photoswitchable valve.

In various aspects, the microchannel stricture has two or more fluid control regions; and one or more analyte sensing region in fluid communication with at least two of the two or more fluid control regions, wherein at least one of the fluid control regions directs the flow of fluid to at least one of the analyte sensing regions. In various embodiments, at least two of the fluid control regions combine with each other prior to linking to the analyte sensing region. In various embodiments, at least one of the fluid control regions is an active fluid control region. In various embodiments, the active fluid control region comprises a photoswitchable valve. In various embodiments, the active fluid control region is a mixing region.

A microfluidic device of the present invention can be configured, e.g., as a hand-held device, a bench-top device, and/or as an implantable device, e.g., a sensor for physiological analytes, chemical hazards, biological hazards, etc. A microfluidic device of the present invention can be configured, e.g., to manipulate one solution, to manipulate multiple solutions, to detect a single analyte, or to detect multiple analytes, or any combination of the same, e.g., as a wide-spectrum physiological sensor.

DETAILED DESCRIPTION OF THE INVENTION

Figure 1:
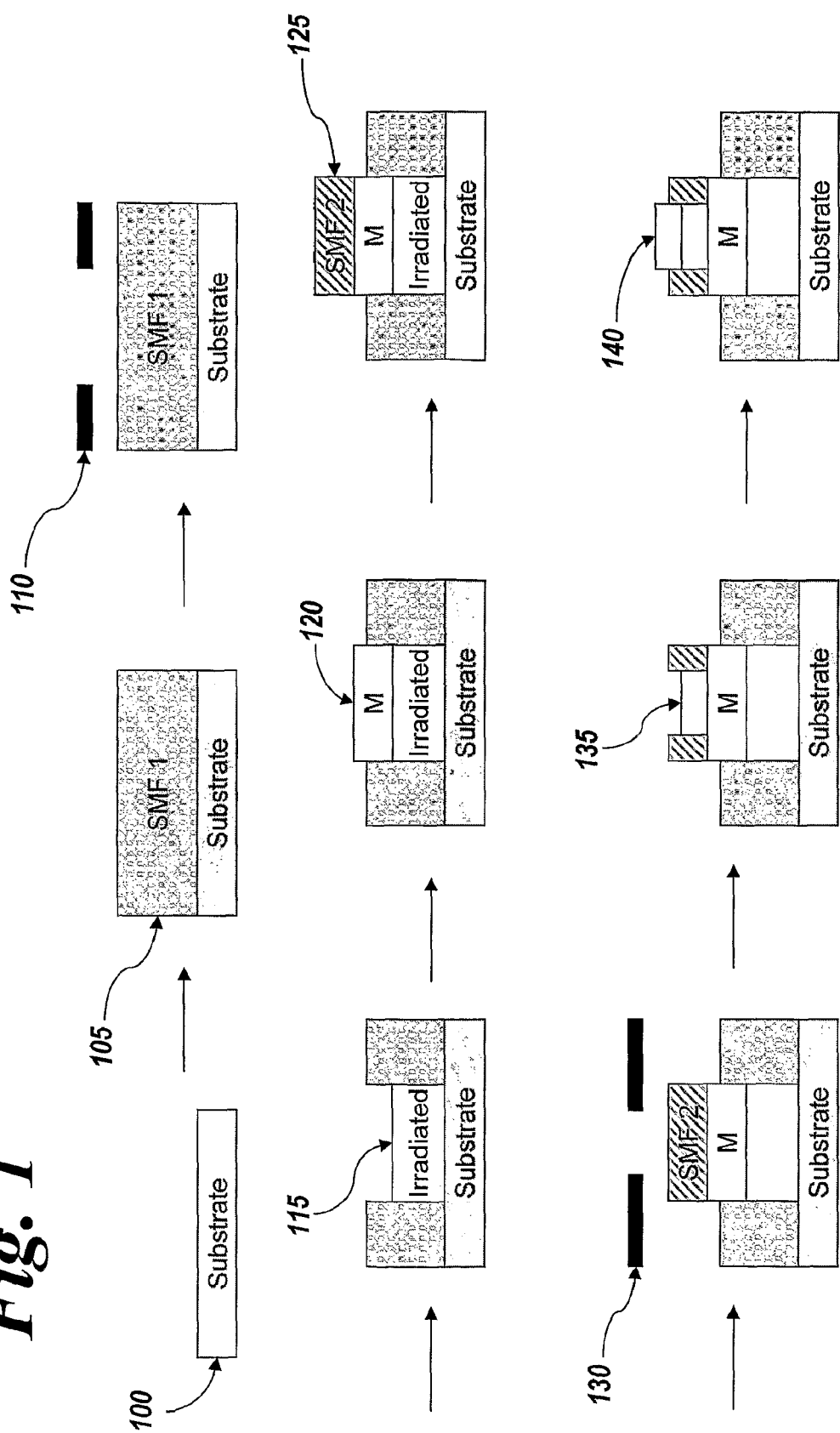
FIG. 1 schematically illustrates various embodiments of a cross-sectional view of an imagewise patterned film of the present invention.

Prior to further describing the invention, it may be helpful to an understanding thereof to set forth definitions of certain terms to be used herein.

As used herein, the article "a" is used in its indefinite sense to mean "one or more" or "at least one." That is, reference to any element of the present invention by the indefinite article "a" does not exclude the possibility that more than one of the element is present.

The terms "imagewise exposing" and "imagewise exposure" are used interchangeably herein to mean that the material and/or surface is imaged using any exposure means that provides a latent image using light. This includes, for example, by analog exposure where an image is formed by projection onto the photosensitive material, such as exposure through a slide or photomask containing a predetermined pattern, as well as by digital exposure where the image is formed one pixel at a time such as by modulation of scanning laser radiation, such as exposure by means of a computer controlled laser or light beam which is moved over the surface of the coated substrate, exposure by means of computer-controlled electron beams, and exposure by means of X-rays or UV rays through a corresponding mask.

As used herein, the term "light" refers to electromagnetic radiation having at least one wavelength in the range between about 190 nanometers (nm) to about 1400 nm. The range includes ultraviolet (UV), visible (vis) and near infrared (NIR) wavelengths. The term light is not limited to coherent electromagnetic radiation (e.g., as provided by a laser) but also includes incoherent radiation (e.g., as provided by a lamp, heater, etc.). The term light includes both broadband radiation (e.g., light comprising a broad range of wavelengths, some of which may be below about 190 nm or above about 1400 nm), multiband radiation, and narrowband radiation. As the term "light" includes the infrared portion of the electromagnetic spectrum, it is to be understood that the phrase "irradiation with light" includes heating. In various embodiments, the wavelength of light is chosen at least partially based upon the wavelength that the organic molecule, e.g., the photo-labile molecule, absorbs.

The term, "photo-labile molecule" is used herein to describe molecules which cleave, e.g., at a predetermined location, upon exposure to light. In various embodiments, photocleavable compounds include, but are not limited to ortho-nitrobenzyl photolinkers and dithiane protected benzoin photolinkers, e.g., 2-nitrobenzyl-11-mercaptoundecanoate, 2-nitrobenzyl-11-(trichlorosilyl)undecanoate, 2-nitrobenzyl undec-10-enoate, 11-(2-nitrobenzyloxy)-11-undecanoic acid, 2-nitrobenzyl 11-bromoundecanoate, di-tert-butyl 5-(11-(2-nitrobenzyloxy)-11-oxoundecyloxy) isophthalate, and/or 5-(1-(2-nitrobenzyloxy)-11-oxoundecyloxy)isophthalic acid, are used as photo-labile molecules. Alternatively, compounds may be synthesized to include a photocleaveable group, thus creating a photo-labile molecule. Methods for such synthesis can be found, e.g., in U.S. Pat. No. 6,881,836 to McGall, et al, the contents of which are incorporated herein by this reference. In various embodiments, photo-labile molecules are stable to a variety of reagents, are rapidly cleaved under mild conditions, and/or do not generate highly reactive byproducts.

"Photochromism" in the scientific literature is often defined as a reversible transformation of a chemical species induced in one or both directions by absorption of electromagnetic radiation between two configurations (or forms), A and B, the two configurations having different absorption spectra. The configurations of a photochromic molecule can be collectively referred to as a photochromic system.

The photochromic processes can involve a one-photon mechanism, multi-photon mechanism, or both. For example, in typical one-photon mechanisms configuration B is formed via a singlet electronic excited state of configuration A, a triplet electronic excited state of configuration A, or both. Configuration B can also be formed from an upper excited state populated by absorption of two or more photons. Typical two-photon mechanisms include, e.g.,: (i) simultaneous absorption of two photons via a virtual level; and (ii) stepwise (or sequential) two-photon absorption where the second photon absorption takes place from a real level.

As used herein, the term "photochromic molecule" refers to molecules that can exhibit photochromism in a free or solvated state. However, as used herein, the term "photochromic molecule" is not limited to molecules which exhibit a reversible transformation between configurations A and B when these molecules are coordinated by one or more donor atoms to the metal atom of a molecular film of the present invention. Accordingly, as used herein, the term "photochromic molecule" includes molecules that when coordinated by one or more donor atoms to the metal atom of a molecular film of the present invention can change from a first configuration to a second configuration upon irradiation with light but which do not substantially revert from the second configuration (e.g., configuration B) back to the first configuration (e.g., configuration A) upon irradiation with light of the same or different wavelength. Examples of photochromic molecules, as the term is used herein, include substituted and unsubstituted: spiropyrans, spirooxazines, dipyridyls, chromenes, spirodihydro-indolizines, diazenes, and combinations thereof.

Preferred photochromic molecules are those molecules that exhibit a substantial change in dipole moment between the first and second configurations of the photochromic molecule. Examples of photochromic molecules include, but are not limited to, 6-nitro-1',3',3'-trimethylspiro(2H-1-benzopyran-2,2'indoline), and 2,2'-dipyridylethylene. Another photochromic molecule of the present invention is 5-(pyren-1-ylmethoxy)isophthalic acid. In some embodiments, photochromic molecules that undergo the photochromic process via a one-photon mechanism are preferred. In various embodiments, photochromic molecules that undergo multiphoton processes are preferred, e.g., to facilitate the fabrication of nanometer-scale features.

In addition, the term photochromic molecule includes molecules which exhibit gated photochromism. Gated photochromism is a type of photochromism in which one or more forms of the photochromic system are transformed (e.g., chemically or electrochemically) reversibly into a nonphotochromic form. The control of the photochromic process can be likened metaphorically to flow through a gate. The opening or closing of the gate can depend on external stimuli such as protonation, oxido-reduction, solvation, and temperature. The term photochromic molecule also includes molecules which may also exhibit acidichromism. Acidichroniism is a type of photochromism in which the protonated form and the conjugate base of some compounds have distinctly different absorption spectra. Acidichromism can occur, e.g., for spirooxazines which generate merocyanines.

The term "photovoltaic molecule" as used herein, typically refers to a compound which is capable of generating an electrical current when the compound is subjected to incidence light. In various embodiments, one or more electrons of the photovoltaic molecule are excited upon exposure to light. This excited electron can then travel through other portions of the film, e.g., other photovoltaic molecules or one or more of the metallic layers, thus generating a current.

As used herein, the term "analyte sensing molecule" typically refers to a molecule that generally includes an analyte binding portion and a fluorophore portion. Analyte sensing molecules can provide both an optical signal (detectable by, e.g., fluorometric techniques) and electrochemical signal (detectable by e.g., potentiometric, amperometric, coulombic, AC analysis, etc. techniques), when an analyte is recognized by an analyte binding portion of the sensing molecule. One or more of these signals can be used to determine the presence and/or concentration of an analyte.

Binding of an analyte to the analyte binding portion results in both an electrochemical signal and an optical signal by changing a fluorescence signal from the fluorophore (e.g., by turning on, turning off, increasing, decreasing, shifting, etc, the fluorescence signal). As a result, the binding of an analyte is transduced by two different mechanisms resulting in two signals (fluorescence and electrochemical) that each provide a separate concentration measurement for the analyte. A comparison of these two concentration measurements (e.g. a ratiometric comparison) provides a measure of the reliability of the measurement.

The terms "microfluidic sensor" and "microfluidic device" typically refer, respectively, to a sensor or device that can operate with sample volumes on the microliter scale. Microfluidic may also refer to the dimensions of the device. A 100×100×100 μm cube is one nanoliter, therefore a channel 10 μm×10 μm×1 cm is also 1 nanoliter. As will become apparent from the following disclosure of the present invention, the present teachings can also provide sensors and devices that can operate with sample volumes on the nanoliter scale. It is to be understood that although the sensors of the present invention are often referred to as "microfluidic sensors" and the devices as "microfluidic devices" herein and in the claims, the phrase "microfluidic" as used in relation to the present invention includes embodiments capable of operation with nanoliter scale sample volumes. When referring to the prior art, however, the term "microfluidic" is not meant to imply that such prior art sensors or devices are capable of operation with nanoliter scale samples. Accordingly, the term "microfluidic" is used in describing the present invention instead of "microfluidic and/or nanofluidic" merely for the sake of conciseness in explanation of the present invention.

The terms "metal" and "metallic layer" as used herein, refer to transition metals. The term "transition metal" includes group 3-12 transition metals, including elements 21 to 30, 39 to 48, and 57 to 80, e.g., elements from scandium to zinc, yttrium to cadmium, and lanthanum to mercury. The term "transition metal" includes, in addition to the main transition group elements, elements of the lanthanide series.

The term "substituted" is intended to describe groups having substituents replacing a hydrogen on one or more atoms, e.g., carbon, nitrogen, oxygen, etc., of a molecule. It will also be noted that the substituents of some of the compounds of this invention include isomeric structures. It is to be understood accordingly that constitutional isomers of particular substituents are included unless indicated otherwise.

Substituents can include, for example, alkyl, alkenyl, alkynyl, halogen, hydroxyl, alkylcarbonyloxy, arylcarbonyloxy, alkoxycarbonyloxy, aryloxycarbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, allylsulfinyl, sulfonato, sulfamoyl, sulfonamido, nitro, trifluoromethyl, cyano, azido, heterocyclyl, alkylaryl, or an aromatic or heteroaromatic group. Accordingly, the phrase "a substituent as described herein" or the like refers to one or more of the above substituents, and combinations thereof.

The term "alkyl" includes saturated aliphatic groups, which includes both "unsubstituted alkyls" and "substituted alkyls", the latter of which refers to alkyl groups having substituents replacing a hydrogen on one or more carbons of the hydrocarbon backbone. The term "alkyl" includes straight-chain alkyl groups (e.g., methyl, ethyl, propyl, butyl, pentyl, hexyl, heptyl, octyl, nonyl, decyl, etc.), branched-chain alkyl groups (isopropyl, tert-butyl, isobutyl, etc.), cycloalkyl (alicyclic) groups (cyclopropyl, cyclopentyl, cyclohexyl, cycloheptyl, cyclooctyl), and cycloalkyl substituted alkyl groups. The term "alkyl" also includes the side chains of natural and unnatural amino acids.

An "alkylaryl" or an "aralkyl" group is an alkyl substituted with an aryl (e.g., phenylmethyl (benzyl)).

The term "aryl" includes 5- and 6-membered single-ring aromatic groups, as well as multicyclic aryl groups, e.g., tricyclic, bicyclic, e.g., naphthalene, anthracene, phenanthrene, etc.). The aromatic ring(s) can be substituted at one or more ring positions with such substituents as described above. Aryl groups can also be fused or bridged with, e.g., alicyclic or heterocyclic rings which are not aromatic so as to form, e.g., a polycycle.

The term "alkenyl" includes unsaturated aliphatic groups analogous in length and possible substitution to the alkyls described above, but which contain at least one double bond. For example, the term "alkenyl" includes straight-chain alkenyl groups (e.g, ethenyl, propenyl, butenyl, pentenyl, hexenyl, heptenyl, octenyl, nonenyl, decenyl, etc.), branched-chain alkenyl groups, cycloalkenyl (alicyclic) groups (cyclopropenyl, cyclopentenyl, cyclohexenyl, cycloheptenyl, cyclooctenyl), alkyl or alkenyl substituted cycloalkenyl groups, and cycloalkyl or cycloalkenyl substituted alkenyl groups. The term alkenyl includes both "unsubstituted alkenyls" and "substituted alkenyls", the latter of which refers to alkenyl groups having substituents replacing a hydrogen on one or more carbons of the hydrocarbon backbone.

The term "alkynyl" includes unsaturated aliphatic groups analogous in length and possible substitution to the alkyls described above, but which contain at least one triple bond. For example, the term "alkynyl" includes straight-chain alkynyl groups (e.g., ethynyl, propynyl, butynyl, pentynyl, hexynyl, heptynyl, octynyl, nonynyl, decynyl, etc.), branched-chain alkynyl groups, and cycloalkyl or cycloalkenyl substituted alkynyl groups. The term alkynyl includes both "unsubstituted alkynyls" and "substituted alkynyls", the latter of which refers to alkynyl groups having substituents replacing a hydrogen on one or more carbons of the hydrocarbon backbone.

The term "acyl" includes compounds and groups which contain the acyl radical ($CH_3CO$—) or a carbonyl group. The term "substituted acyl" includes acyl groups having substituents replacing a one or more of the hydrogen atoms.

The term "acylamino" includes groups wherein an acyl group is bonded to an amino group. For example, the term includes alkylcarbonylamino, arylcarbonylamino, carbamoyl and ureido groups.

The term "aroyl" includes compounds and groups with an aryl or heteroaromatic group bound to a carbonyl group. Examples of aroyl groups include phenylcarboxy, naphthyl carboxy, etc.

The terms "alkoxyalkyl", "alkylaminoalkyl" and "thioalkoxyalkyl" include alkyl groups, as described above, which further include oxygen, nitrogen or sulfur atoms replacing one or more carbons of the hydrocarbon backbone, e.g., oxygen, nitrogen or sulfur atoms.

The term "alkoxy" includes substituted and unsubstituted alkyl, alkenyl, and alkynyl groups covalently linked to an oxygen atom. Examples of alkoxy groups include methoxy, ethoxy, isopropyloxy, propoxy, butoxy, and pentoxy groups and may include cyclic groups such as cyclopentoxy.

The term "amine" or "amino" includes compounds where a nitrogen atom is covalently bonded to at least one carbon or heteroatom. The term "alkyl amino" includes groups and compounds wherein the nitrogen is bound to at least one additional alkyl group. The term "dialkyl amino" includes groups wherein the nitrogen atom is bound to at least two additional alkyl groups. The term "arylamino" and "diarylamino" include groups wherein the nitrogen is bound to at least one or two aryl groups, respectively. The term "alkylarylamino," "alkylaminoaryl" or "arylaminoalkyl" refers to an amino group that is bound to at least one alkyl group and at least one aryl group. The term "alkaminoalkyl" refers to an alkyl, alkenyl, or alkynyl group bound to a nitrogen atom that is also bound to an alkyl group.

The term "amide" or "aminocarboxy" includes compounds or groups that contain a nitrogen atom that is bound to the carbon of a carbonyl or a thiocarbonyl group. The term includes "alkaminocarboxy" groups that include alkyl, alkenyl, or alkynyl groups bound to an amino group bound to a carboxy group. It includes arylaminocarboxy groups that include aryl or heteroaryl groups bound to an amino group which is bound to the carbon of a carbonyl or thiocarbonyl group. The terms "allylaminocarboxy," "alkenylaminocarboxy," "alkynylaminocarboxy," and "arylaminocarboxy" include groups wherein alkyl, alkenyl, alkynyl and aryl groups, respectively, are bound to a nitrogen atom which is in turn bound to the carbon of a carbonyl group.

The term "carbonyl" or "carboxy" includes compounds and groups which contain a carbon connected with a double bond to an oxygen atom, and tautomeric forms thereof. Examples of groups that contain a carbonyl include aldehydes, ketones, carboxylic acids, amides, esters, anhydrides, etc. The term "carboxy group" or "carbonyl group" refers to groups such as "alkylcarbonyl" groups wherein an alkyl group is covalently bound to a carbonyl group, "alkenylcarbonyl" groups wherein an alkenyl group is covalently bound to a carbonyl group, "alkynylcarbonyl" groups wherein an alkynyl group is covalently bound to a carbonyl group, "arylcarbonyl" groups wherein an aryl group is covalently attached to the carbonyl group. Furthermore, the term also refers to groups wherein one or more heteroatoms are covalently bonded to the carbonyl group. For example, the term includes groups such as, for example, aminocarbonyl groups, (wherein a nitrogen atom is bound to the carbon of the carbonyl group, e.g., an amide), aminocarbonyloxy groups, wherein an oxygen and a nitrogen atom are both bond to the carbon of the carbonyl group (e.g., also referred to as a "carbamate"). Furthermore, aminocarbonylamino groups (e.g., ureas) are also include as well as other combinations of carbonyl groups bound to heteroatoms (e.g., nitrogen, oxygen, sulfur, etc. as well as carbon atoms). Furthermore, the heteroatom can be further substituted with one or more alkyl, alkenyl, alkynyl, aryl, aralkyl, acyl, etc. groups.

The term "ether" includes compounds or groups that contain an oxygen bonded to two different carbon atoms or heteroatoms. For example, the term includes "alkoxyalkyl" which refers to an alkyl, alkenyl, or alkynyl group covalently bonded to an oxygen atom that is covalently bonded to another alkyl group.

The term "ester" includes compounds and groups that contain a carbon or a heteroatom bound to an oxygen atom that is bonded to the carbon of a carbonyl group. The term "ester" includes alkoxycarboxy groups such as methoxycarbonyl, ethoxycarbonyl, propoxycarbonyl, butoxycarbonyl, pentoxycarbonyl, etc. The alkyl, alkenyl, or alkynyl groups are as defined above.

The term "thioether" includes compounds and groups which contain a sulfur atom bonded to two different carbon or hetero atoms. Examples of thioethers include, but are not limited to alkthioalkyls, alkthioalkenyls, and alkthioalkynyls. The term "alkthioalkyls" include compounds with an alkyl, alkenyl, or alkynyl group bonded to a sulfur atom that is bonded to an alkyl group. Similarly, the term "alkthioalkenyls" and alkthioalkynyls" refer to compounds or groups wherein an alkyl, alkenyl, or alkynyl group is bonded to a sulfur atom which is covalently bonded to an alkynyl group.

The term "hydroxy" or "hydroxyl" includes groups with an —OH or —O⁻.

The term "halogen" includes fluorine, bromine, chlorine, iodine, etc. The term "perhalogenated" generally refers to a group wherein all hydrogens are replaced by halogen atoms.

The term "heteroatom" includes atoms of any element other than carbon or hydrogen. Preferred heteroatoms are nitrogen, oxygen, sulfur and phosphorus.

The term "heterocycle" or "heterocyclic" includes saturated, unsaturated, aromatic ("heteroaryls" or "heteroaromatic") and polycyclic rings which contain one or more heteroatoms. The heterocyclic may be substituted or unsubstituted. Examples of heterocyclics include, for example, benzodioxazole, benzofuran, benzoimidazole, benzothiazole, benzothiophene, benzoxazole, chromene, deazapurine, furan, indole, indolizine, imidazole, isoxazole, isoindole, isoquinoline, isothiaozole, methylenedioxyphenyl, napthridine, oxazole, purine, pyran, pyrazine, pyrazole, pyridazine, pyridine, pyrimidine, pyrrole, quinoline, tetrazole, thiazole, thiophene, and triazole. Other heterocycles include morpholino, piprazine, piperidine, thiomorpholino, and thioazolidine.

The term "ORMOSIL" refers to organically modified silicates. One example of an ORMOSIL is polydimethyl siloxane (PDMS). Examples of ORMOSIL gels include gel structures of the formulae (Ia) and (Ib):

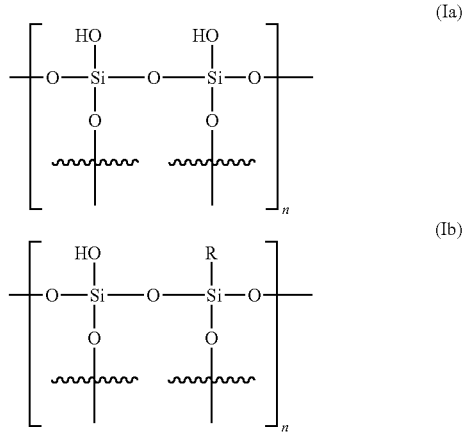

where R represents, e.g., a substituted or unsubstituted: alkyl, alkenyl, aryl, ether, heterocycle, heteroaryl, and combinations thereof. For example, in various embodiments R is a 2,6-pyridinedicarboxylate group.

The terms "polycyclyl" or "polycyclic radical" include groups with two or more rings (e.g., cycloalkyls, cycloalkenyls, cycloalkynyls, aryls and/or heterocyclyls) in which two or more carbons are common to two adjoining rings, e.g., the rings are "fused rings". Rings that are joined through non-adjacent atoms are termed "bridged" rings. Each of the rings of the polycycle can be substituted with such substituents as described above.

The term "thiocarbonyl" or "thiocarboxy" includes compounds and groups which contain a carbon connected with a double bond to a sulfur atom. The term "thiocarbonyl group" includes groups that are analogous to carbonyl groups. For example, "thiocarbonyl" groups include aminothiocarbonyl, wherein an amino group is bound to the carbon atom of the thiocarbonyl group, furthermore other thiocarbonyl groups include, oxythiocarbonyls (oxygen bound to the carbon atom), aminothiocarbonylamino groups, etc.

It will be noted that the structures of some of the compounds of this invention include asymmetric carbon atoms. It is to be understood accordingly that the isomers arising from such asymmetry (e.g., all enantiomers and diastereomers) are included within the scope of this invention, unless indicated otherwise. Furthermore, the structures and other compounds, groups and groups discussed in this application also include all tautomers thereof.

Additionally, the phrase "and combination thereof" implies that any number of the listed functional groups and molecules may be combined to create a larger molecular architecture. For example, the terms "pyridine," two "carbonyl" (or "C=O"), and two "—OH," (or, e.g., two carboxylates —COOH) can be combined to form a dicarboxypyridine substituent. It is to be understood that when combining functional groups and molecules to create a larger molecular architecture, hydrogens can be removed or added as required to satisfy the valence of each atom.

By "biological sample" is meant any sample of biological origin, including samples of biological origin which have been chemically or physically treated, diluted, or concentrated prior to analysis. Examples of biological samples include, but are not limited to, blood serum, blood plasma, whole blood, urine, cerebrospinal fluid, amniotic fluid, saliva, tears, cell lysates and culture media.

Methods for Imagewise Patterning

Referring to FIG. 1, in various aspects, the present invention provides methods for imagewise patterning of a substrate surface 100, which include forming a first substantially monolayer thick film (SMF) 105 on at least a portion of the surface, wherein the first SMF comprises at least one photolabile molecule. In various embodiments, the first SMF is comprised of molecules able to interact with the surface of the substrate. For example, the substrate may be gold, and the first SMF may be made of an alkane thiol, e.g., a photolabile alkane thiol. The methods further include imagewise exposing at least a portion of the first SMF to a first wavelength of light, such that a first irradiated portion 115 is formed. Imagewise exposing can include, e.g., exposing to light through a photomask having a first pattern 110. Imagewise exposing can include, e.g., exposing to a beam of light traveling in a pattern. The methods continue with contacting at least a portion of the first irradiated portion with a first metal ion, such that a first metallic layer 120 is formed. Without wishing to be bound by any particular theory, it is believed that the metal ion forms a non-covalent interation with the irradiated portion of the film. The methods can continue by forming a second substantially monolayer thick film 125 on at least a portion of the metallic layer. Again, without wishing to be bound by any particular theory, it is believed that the molecules in the second SMF form non-covalent interactions with the metal ions in the metallic layer. The methods also include imagewise exposing at least a portion of the second substantially monolayer thick film with a second wavelength of light, such that a second irradiated portion 135 is formed. The second wavelength of light may be the same or different than the first wavelength of light, depending upon, e.g., the attributes of the molecules in the second SMF or the desired level of excitation of the molecule. In various embodiments, a photomask with a second pattern 130 can be used during the imagewise exposure. In various embodiments, the second photomask has the same two dimensional shape as the first photomask. In various embodiments, the second photomask has a different shape as the first photomask. The methods further include contacting at least a portion of the second irradiated portion with a second metal ion, such that a second metallic layer 140 is formed. The second metal layer may include the same metal as the first metal layer, or the second metal may include a different metal from the first metal layer. The above steps may be repeated as desired to form additional patterns and three-dimensional attributes on the surface of the substrate, e.g., a third SMF can be formed on the second metal layer.

Figure 2:
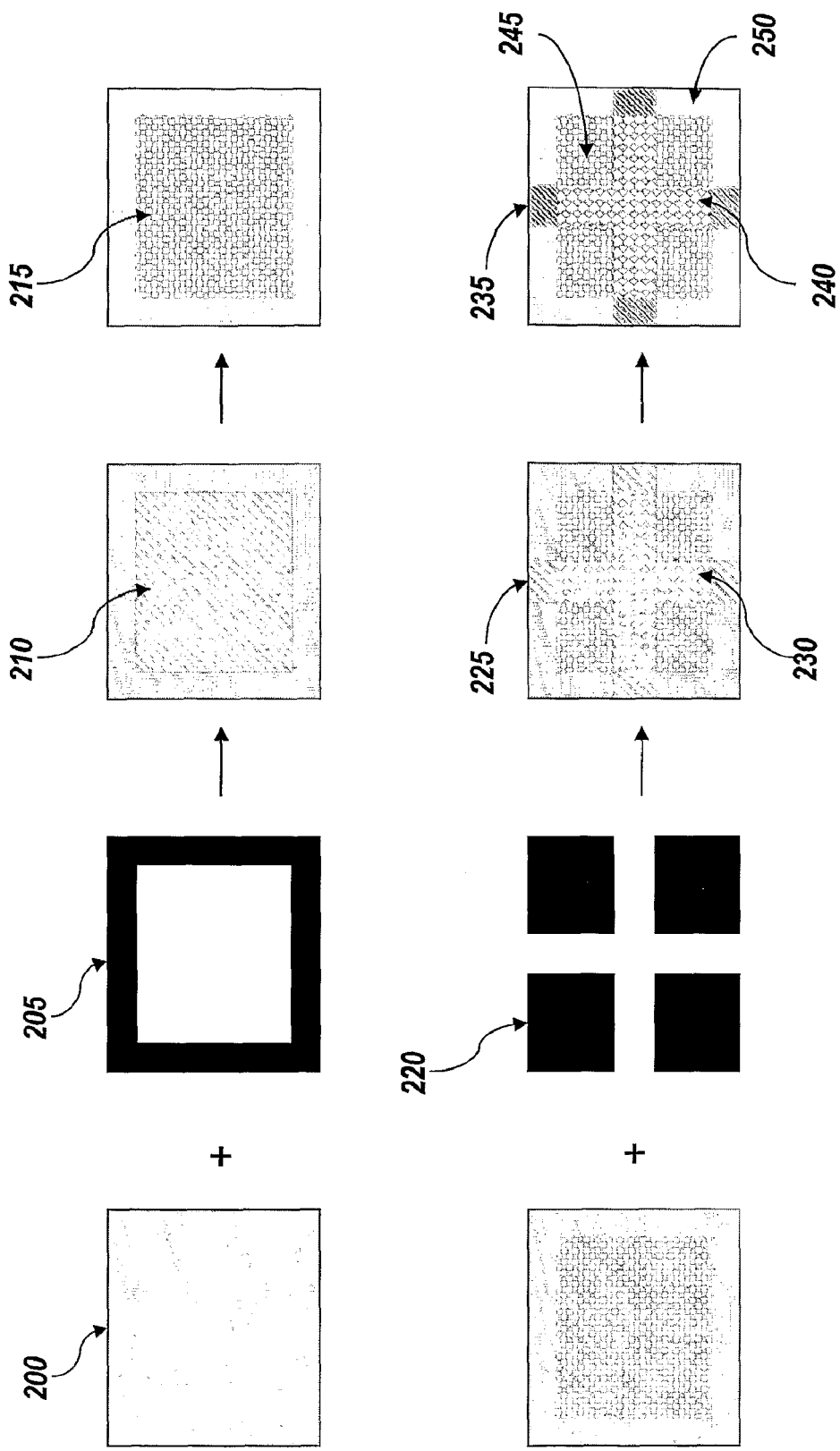
FIG. 2 schematically illustrates various embodiments of a top-down view of an imagewise patterned film of the present invention.

It may be appreciated that the present invention is not limited by shape or design, and that any two or three dimensional pattern may be formed using the methods described herein. Referring to FIG. 2, in various aspects the present invention provides methods for complex imagewise patterning of a substrate surface, which includes imagewise exposing at least a portion of a first SMF on the surface 200 to a first wavelength of light using, e.g., a photomask having a first pattern 205, such that a first irradiated portion 210 is formed.

The methods further include contacting at least a portion of the first irradiated portion with a first metal ion, such that a first metallic layer is formed followed by forming a second substantially monolayer thick film 215 on at least a portion of the metallic layer. In various embodiments, the second SMF includes molecules of same or similar structure to the first SMF, In various embodiments, the second SMF includes molecules of different structure to the first SMF. The methods also include imagewise exposing at least a portion of one or more of the first and second substantially monolayer thick films with a second wavelength of light, using e.g., a photomask having a second pattern 220, such that a second irradiated portion is formed. In various embodiments, the second irradiated portion includes a portion 225 having a first irradiated SMF, as well as a portion 230 having a first irradiated SMF and a second irradiated SMF linled via a metallic. In various embodiments, the foregoing steps may be repeated. For example, the methods of the present invention can include contacting the second irradiated portion with a second metal ion, such that a second metallic layer is formed, followed by forming a third SMF on at least a portion of the second metallic layer. In various embodiments, the third SMF has a different structure than the first and/or second and/or both SMFs. Alternately, the third SMF has the same structure as the first and/or second and/or both SMFs. In various embodiments, the third SMF is a cap layer. For example, the third SMF can include a photovoltaic molecule, a photochromic molecule, and/or an analyte sensing molecule. In various embodiments, the resultant film can include portions 235 that include the first irradiated SMF and the third SMF linked via the second metallic layer, portions 240 that include the first irradiated SMF and the second irradiated SMF linked via the first metallic layer, and the third SMF, linked to the second irradiated SMF via the second metallic layer, portions 245 that include the first irradiated SMF and the second SMF linked via the first metallic layer, and portions 250 that include only the first SMF.

Figure 3A:
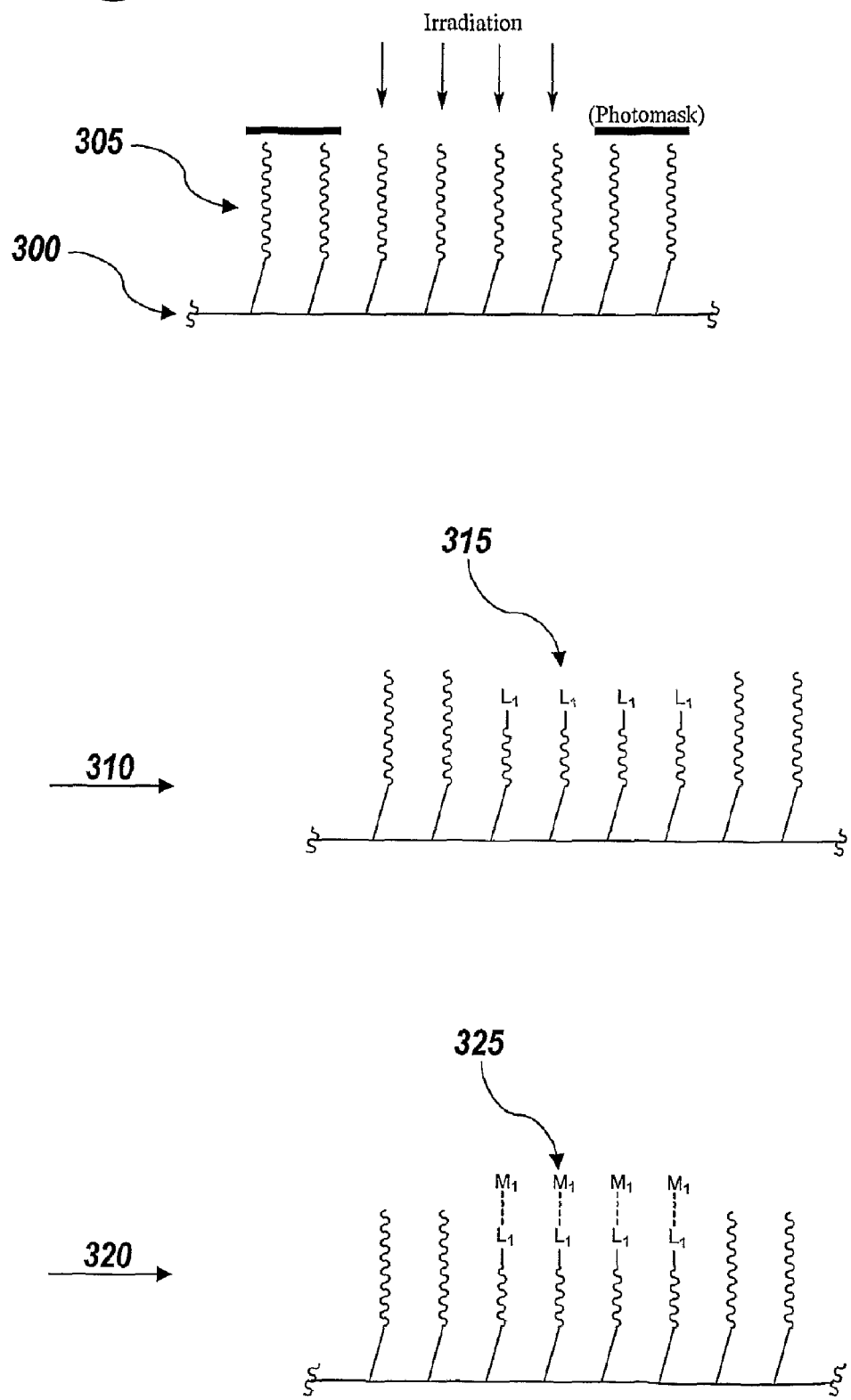
FIGS. 3A-3C schematically illustrates various embodiments of an imagewise patterned film of the present invention.
Figure 3B:
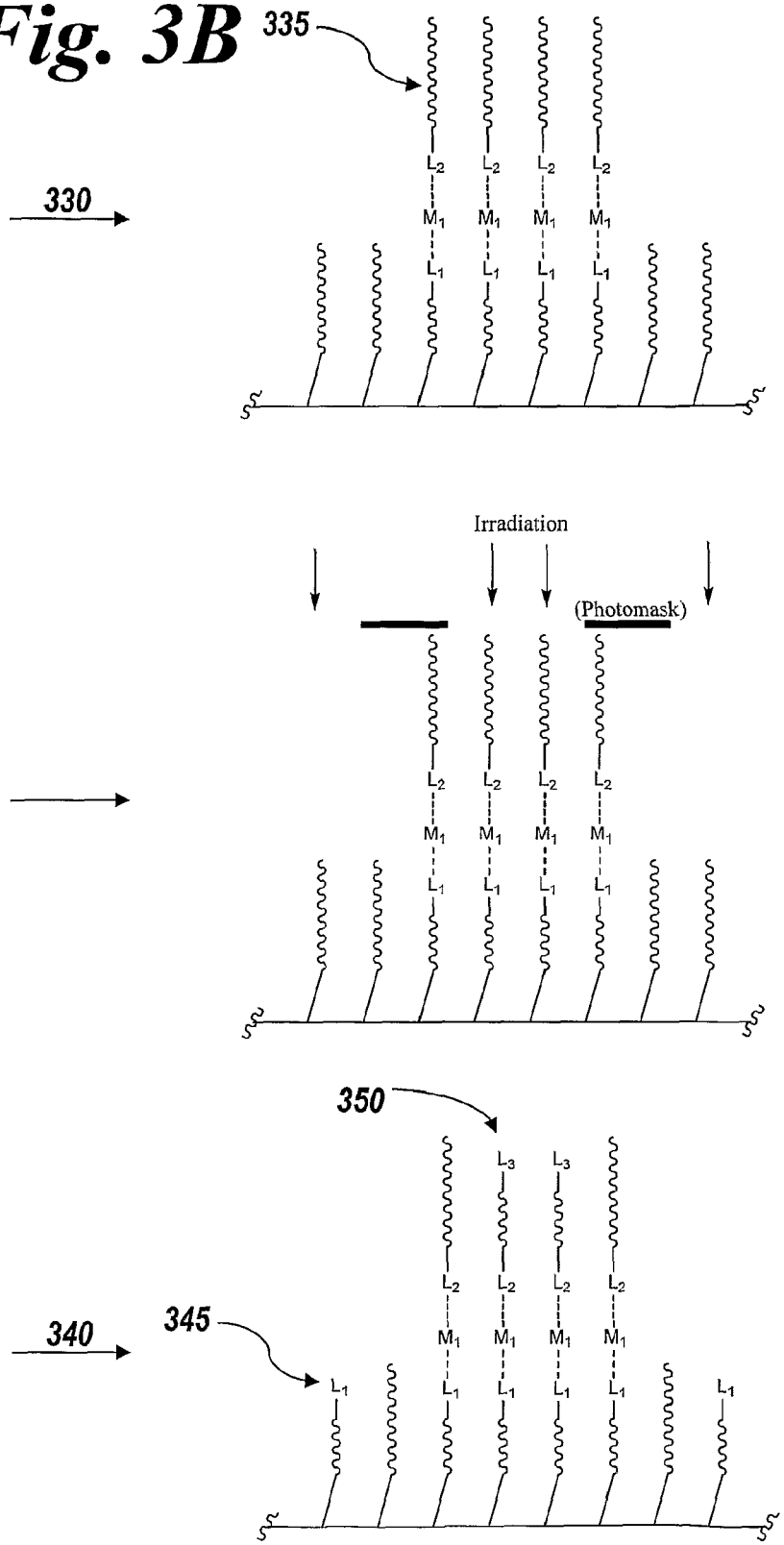
Figure 3C:
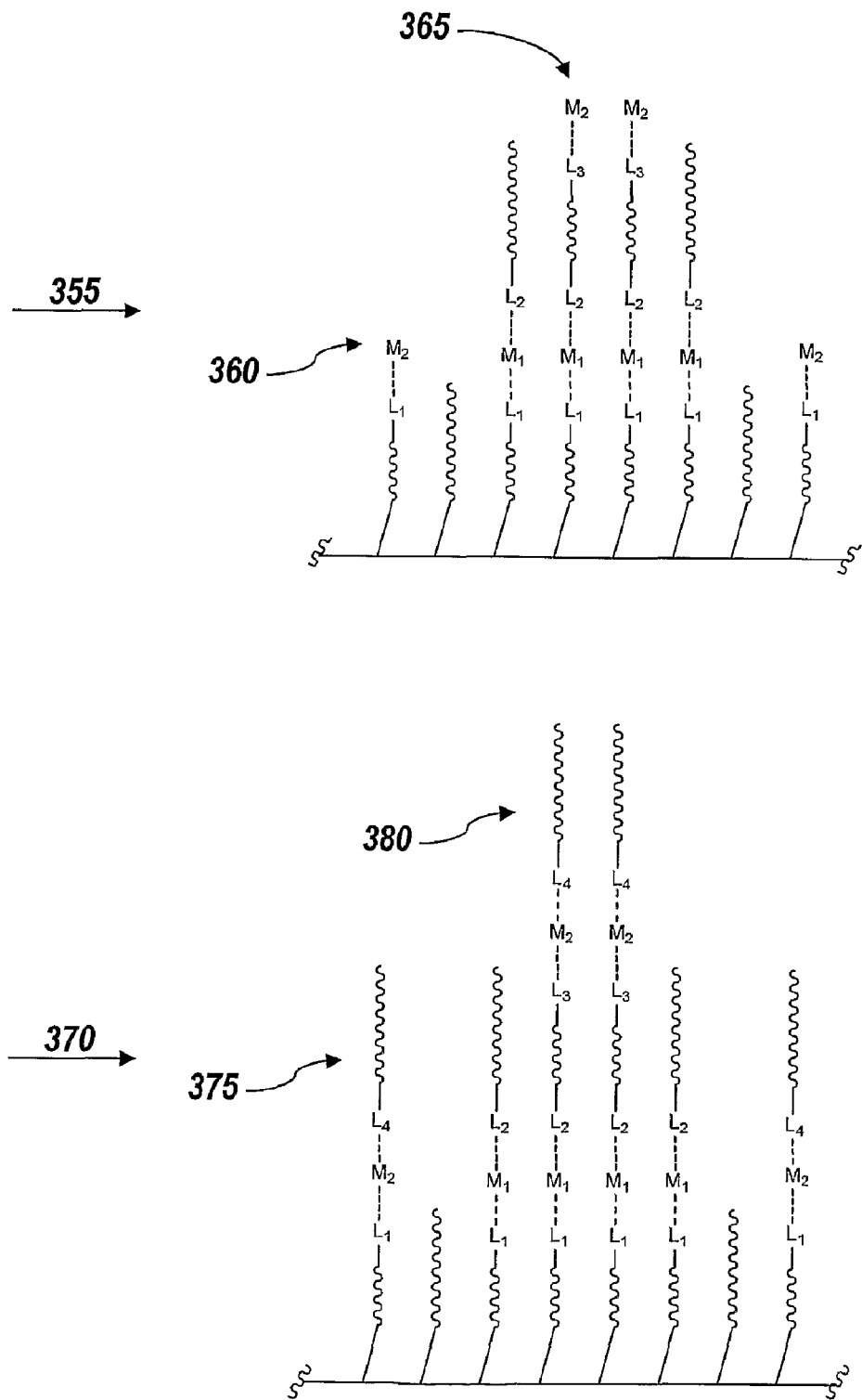
Figure 4A:
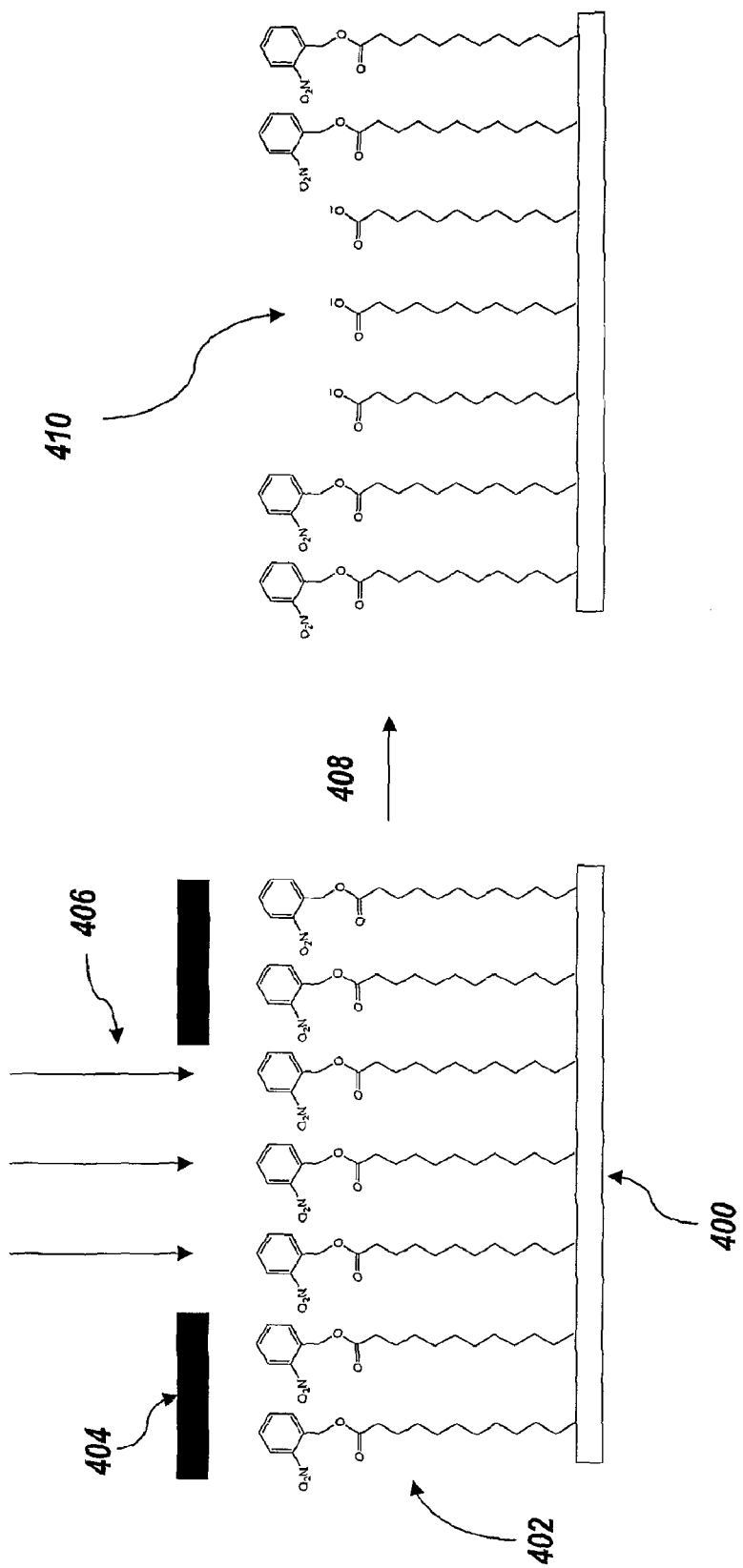
FIGS. 4A-4E schematically illustrate various embodiments of methods and films of the present invention.
Figure 4B:
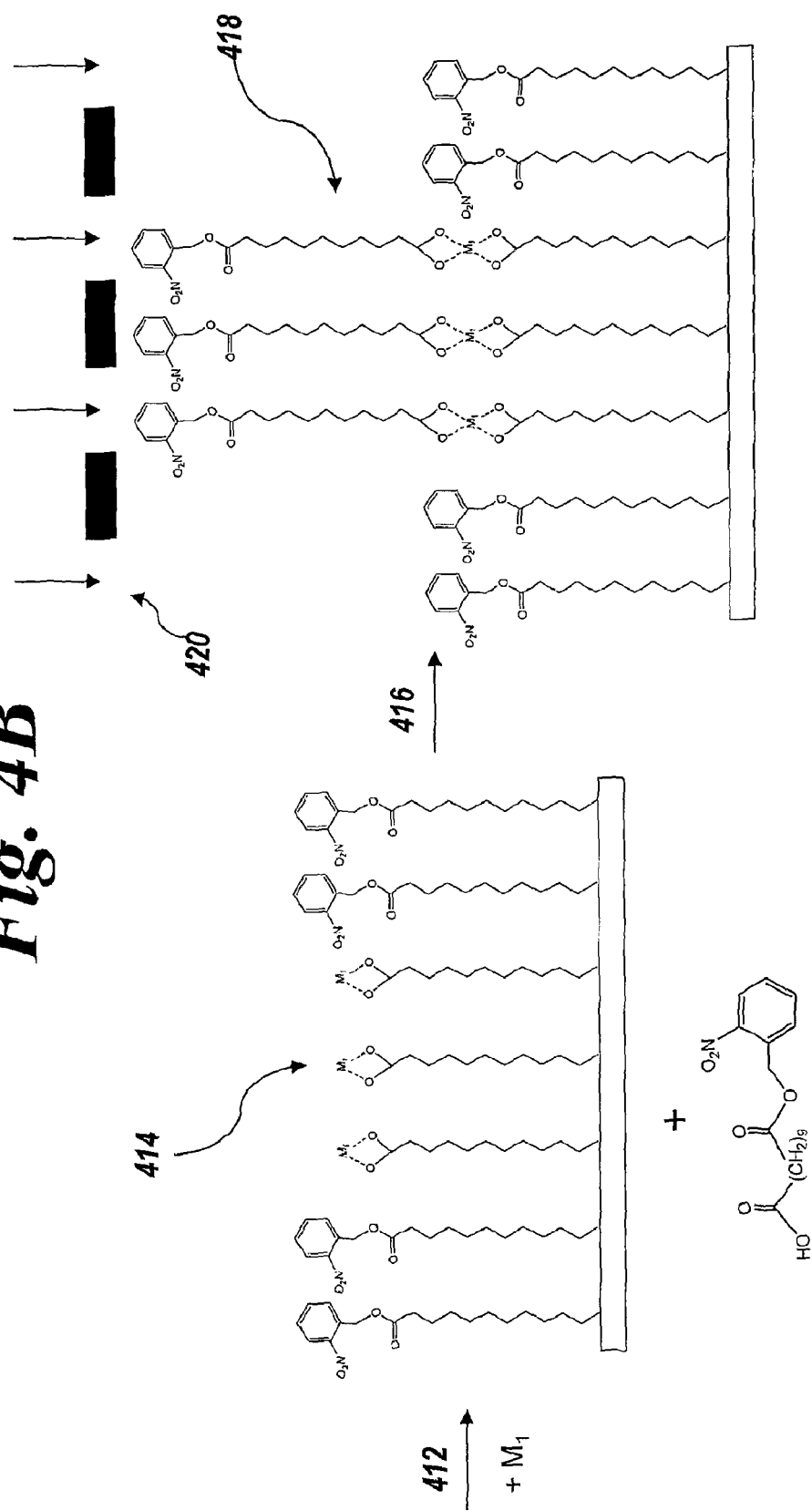
Figure 4C:
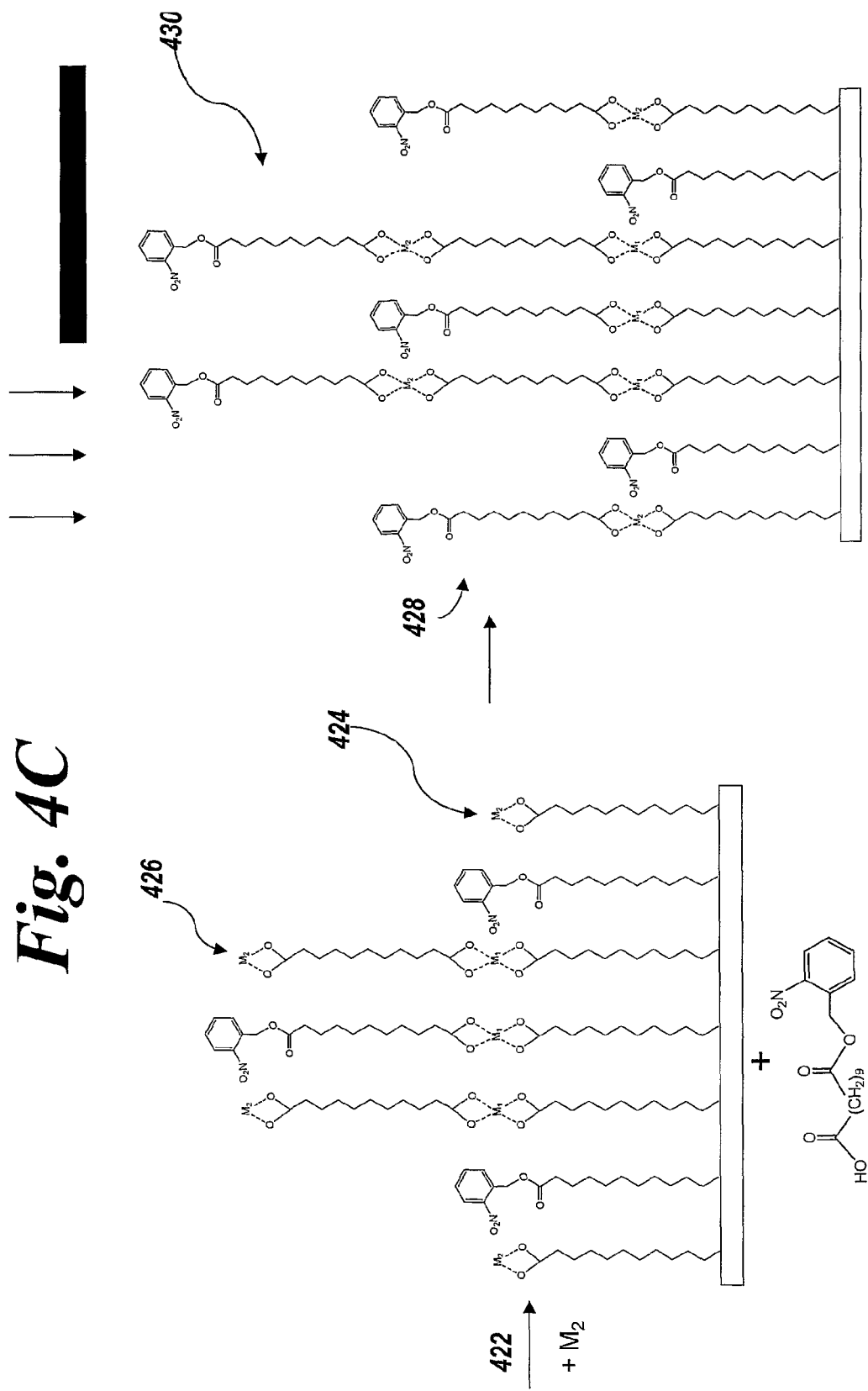
Figure 4D:
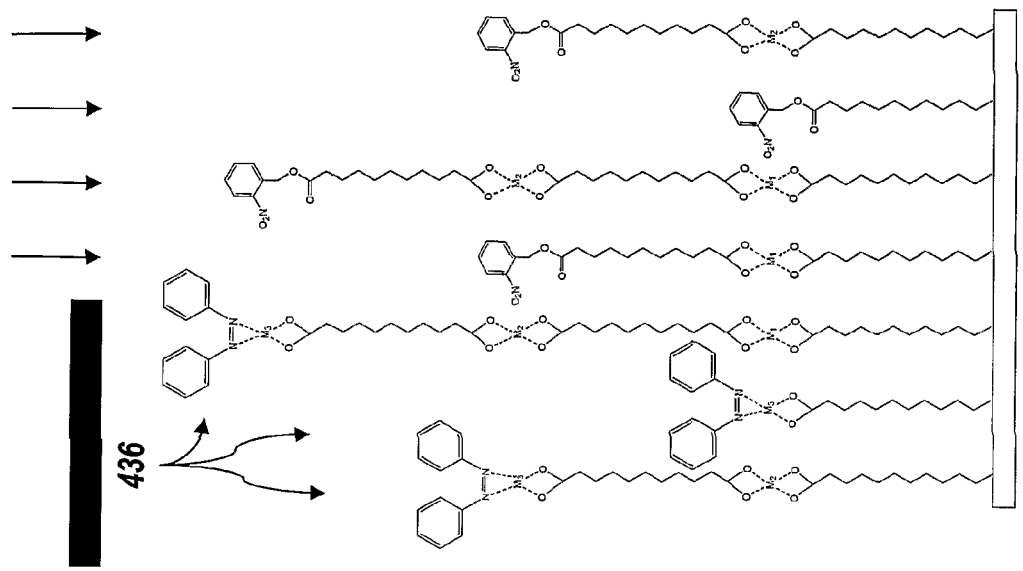
Figure 4D:
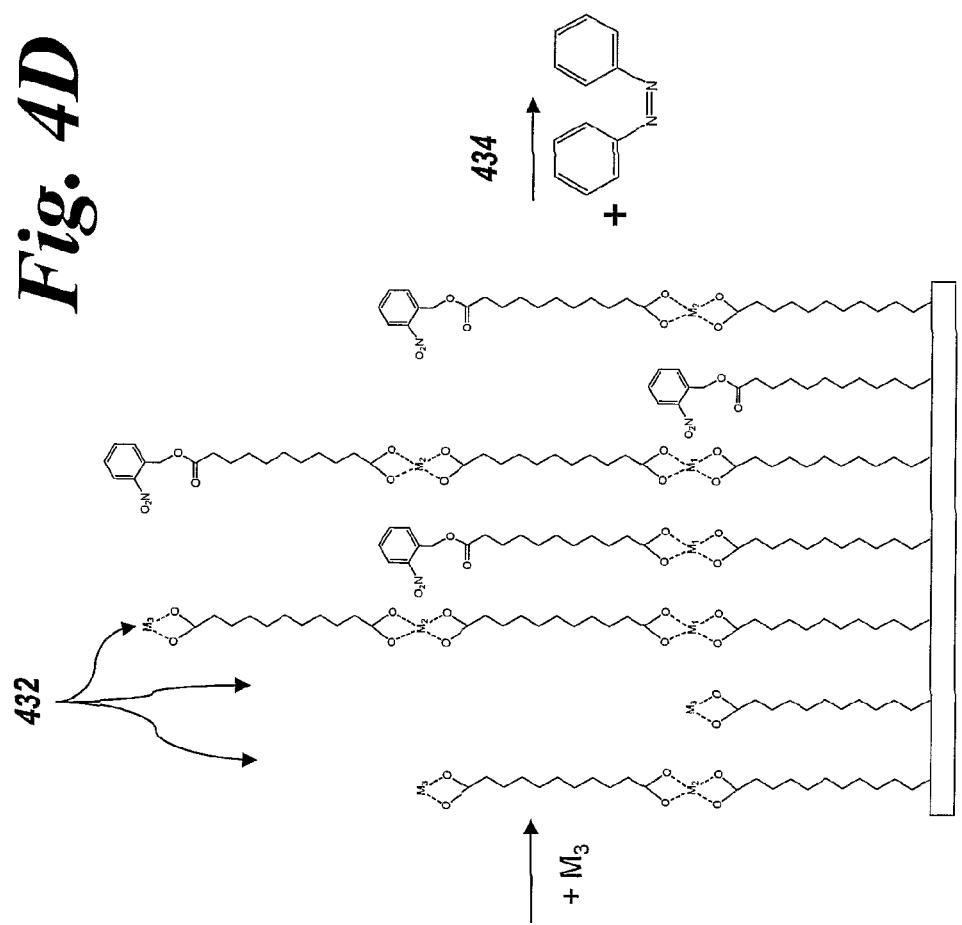
Figure 4E:
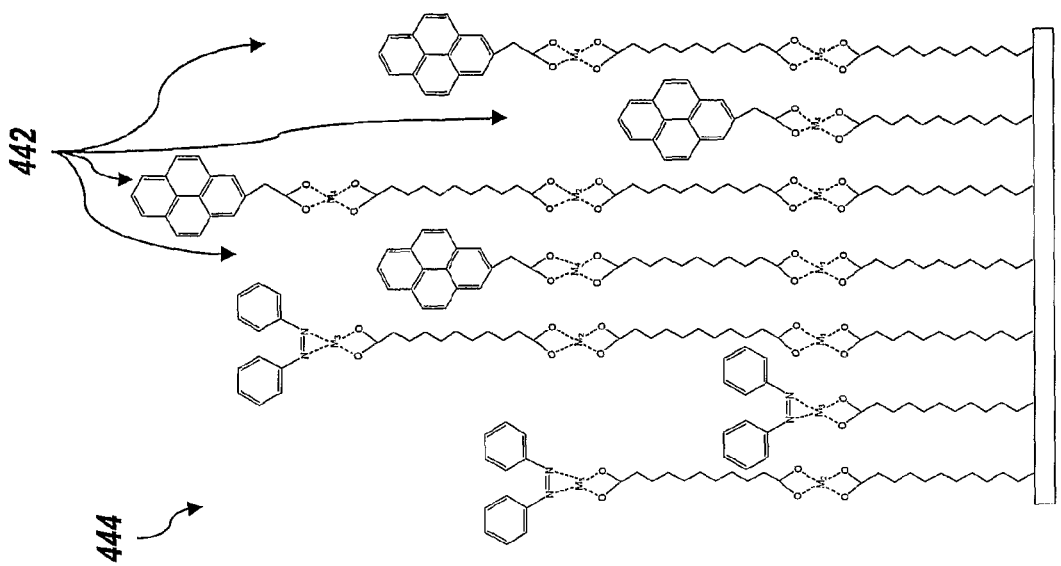
Figure 4E:
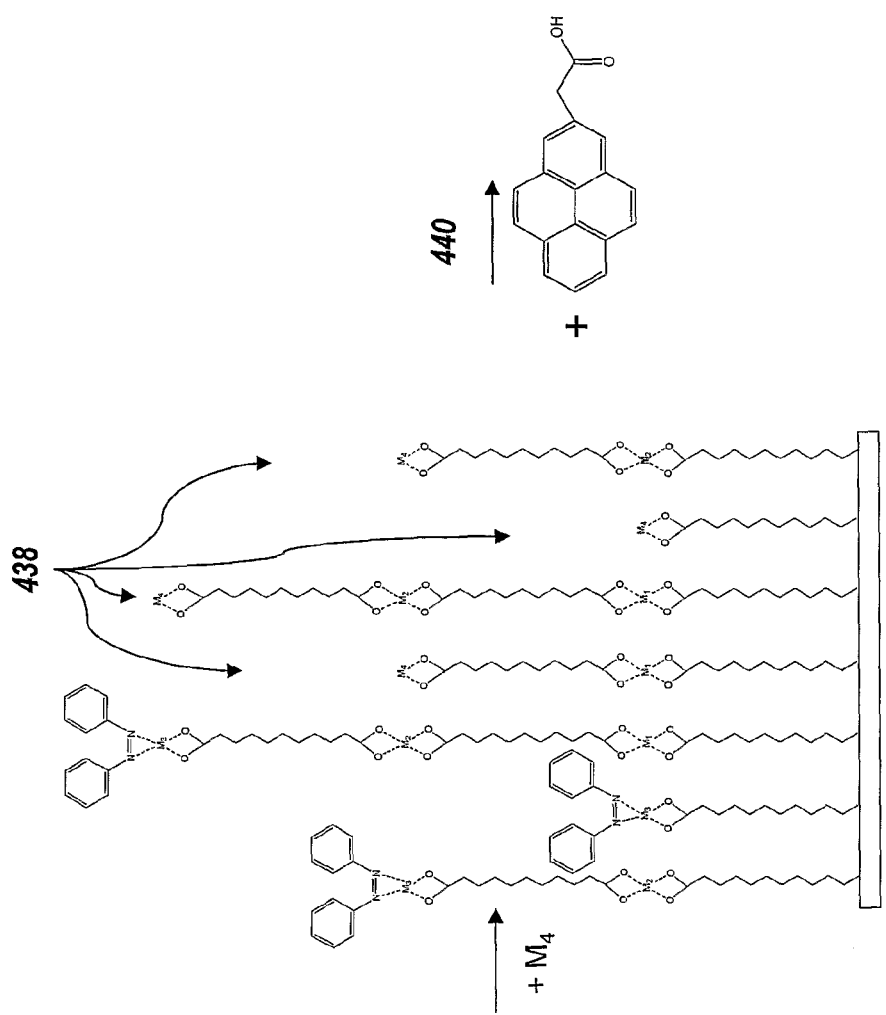

FIGS. 3A-3C schematically depict at a molecular level view, various steps of methods of the present invention. In various embodiments, there is no need for isolation or purification in between steps. In other embodiments, purification or isolation, e.g., rinsing, is performed between one or more of the steps. For example, the method can include forming on a substrate surface 300, a first SMF 305, e.g., by washing with a solution comprising a compound capable of forming the first SMF over the surface. Examples of such compounds include, but are not limited to 2-nitrobenzyl undec-10-enoate, 11-(2-nitrobenzyloxy)-11-oxoundecanoic acid, 2-nitrobenzyl 11-mercaptoundecanoate, and 2-nitrobenzyl 11-(trichlorosilyl)undecanoate. The methods can further include imagewise exposing 310 the SMF, e.g., by irradiating with light in a first pattern. In various embodiments, the portion of the SMF that has been irradiated then becomes able to coordinate to a metal, e.g., it gains the properties of a ligand (e.g., $L_1$) 315. The methods can continue with contacting the surface with a first metal (e.g., Ml) 320, thus coordinating the metal with the ligand-portion of the irradiated SMF to form a metal-ligand complex 325. The methods can also include contacting 330 the metal-ligand complex with a second molecule that also has the ability to coordinate to the metal, e.g., forming a second SMF on the metallic surface of the metal-ligand complex 335. In various embodiments, the methods further include imagewise exposing 340 of the surface, e.g., with light in a second pattern. Again, in various embodiments, the irradiated portions become able to coordinate to a metal. With a second exposure to light, the irradiated portion may be an irradiated first SMF 345, similar to the first exposure to light, or it may be an irradiated second SMF 350. The ligands formed (e.g., $L_1$ and $L_3$) may be the same or may be different, depending upon, for example, the nature of the molecules used to form the first and second SMFs and the desired product. In various embodiments, $L_1$ and $L_3$ are the same. The methods can further include contacting 355 the surface with a second metal (e.g., $M_2$), thus forming both a metal-ligand complex 360, and a bimetallic complex 365. The methods can further include contacting 370 these metal-ligand complexes with a third molecule that also has the ability to coordinate to the metal, thus forming both a metal ligand complex 375 and a trimetallic complex 380. In various embodiments, the third SMF can be the same as or different than the second or first SMFs used in the previous steps, e.g., $L_2$ and $L_4$ can be the same or different.

FIGS. 4A-4E depict a specific, non-limiting film of the present invention and formation of the same. In various embodiments, an SMF 402 assembles itself in a substantially regular fashion onto a substrate surface 400. Upon imagewise exposing, e.g. irradiating 406 in the presence of a photomask 404, and optionally washing with an appropriate solution 408, e.g., NaOH, the irradiated portion will cleave to form a series of carboxylate ions on the irradiated surface 410, which can serve as ligands to a metal ion. Any SMF which would undergo cleavage, or similar reaction, to form a group which may serve as a ligand, would be appropriate for use. In various embodiments, the resulting carboxylate ions can be contacted 412 with a metal ion (e.g., $M_1$), thus coordinating metal to the ligand and forming a metallic layer 414 on a portion of the surface. In various embodiments, the carboxylate ions can be contacted with the metal ions by washing a solution of metal ions over the entire surface. In various embodiments, the carboxylate ions can be contacted with the metal ions by washing a solution of metal ions over a portion of the surface. Upon forming a second SMF, e.g., by contacting the metallic layer with an appropriate molecule 416, a metal-ligand complex 418 is also formed. Upon a second imagewise exposing 420, and subsequent contacting 422 with a metal ion (e.g., $M_2$), a second metallic layer is formed. In various embodiments, the metallic layer is formed on the surface of at least a portion of the first SMF 424. In various embodiments, the metallic layer is formed on the surface of at least a portion of the second SMF 426. In various embodiments, the second metallic layer is formed on the surface of at least a portion of both the first SMF and the second SMF. In various embodiments, a third SMF is formed on the second metallic layer, thus forming a metal-ligand complex 428 and a bimetallic complex 430.

Multiple layers, as desired, are formed in various embodiments of the present invention by repeating, for example, the steps of imagewise exposing and contacting with a metal ion (e.g., $M_3$), to form a third metallic layer 432. The metallic layer, in various embodiments, can then be contacted with a first functional molecule 434, e.g., a photochromic molecule, to form a photochromic portion on the film 436. Methods of the present invention, in various embodiments, can further include repeating the steps of imagewise exposing and contacting with a metal ion (e.g., $M_4$), to form a fourth metallic layer 438. The metallic layer, in various embodiments, can then be contacted with a second functional molecule 440, e.g., a photovoltaic molecule, to form a photovoltaic portion on the film 442. In various embodiments, the resulting film 444, can have more than one layer and more than one functionality. In various embodiments, the resulting film can have one functionality and more than one layer. In various embodiments, the resulting film can have one layer and more than one functionality.

Figure 5:
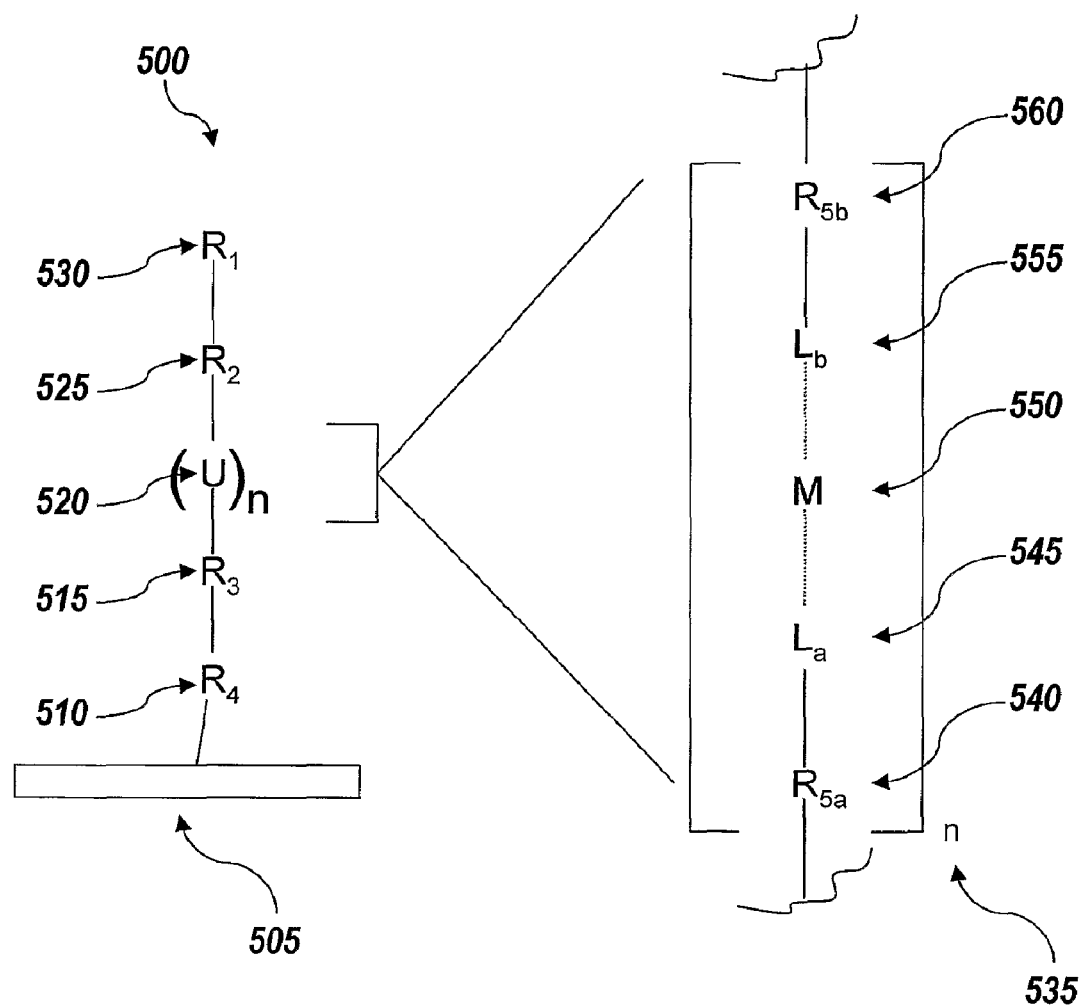
FIG. 5 schematically illustrates various embodiments of the structure of a unit contained within an imagewise patterned film of the present invention.
Figure 6A:
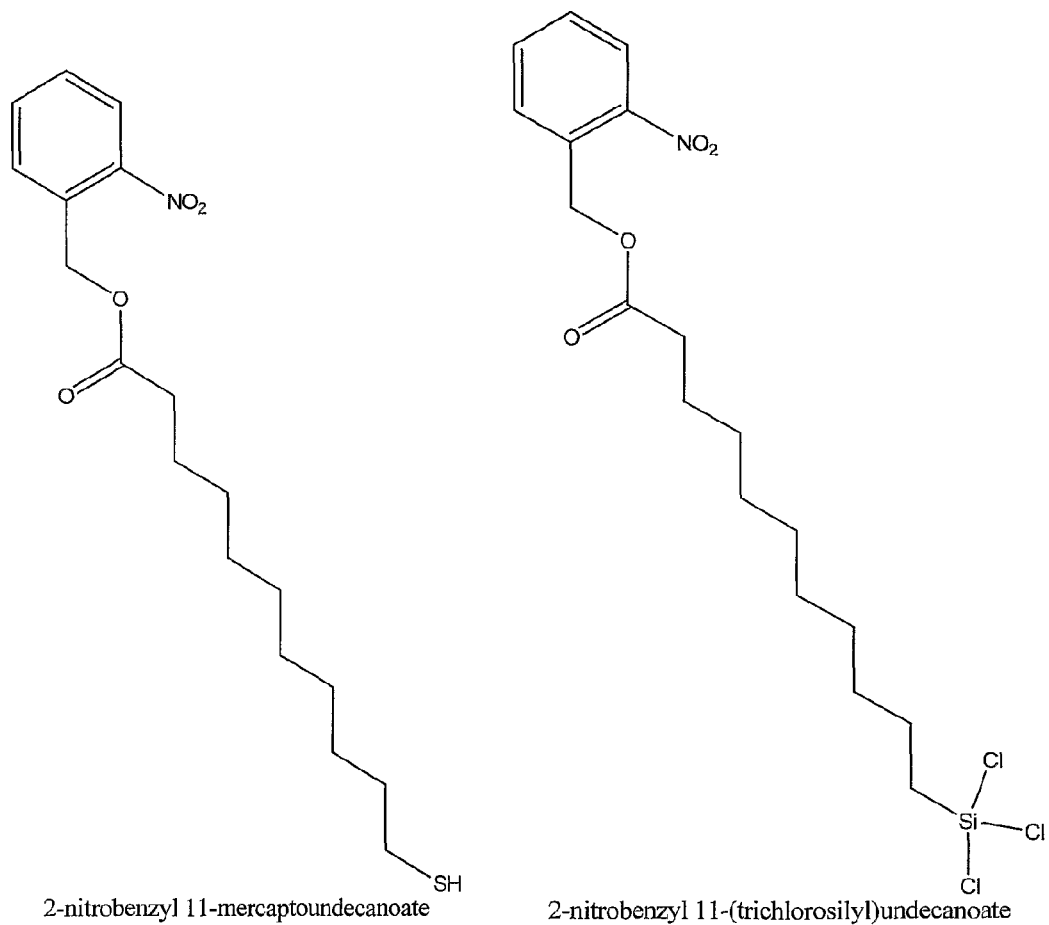
FIGS. 6A-6C include photo-labile molecules suitable for various embodiments of the present invention.
Figure 6B:
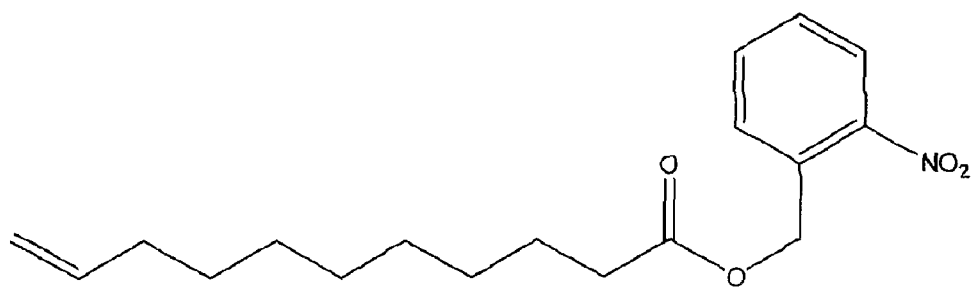
Figure 6B:
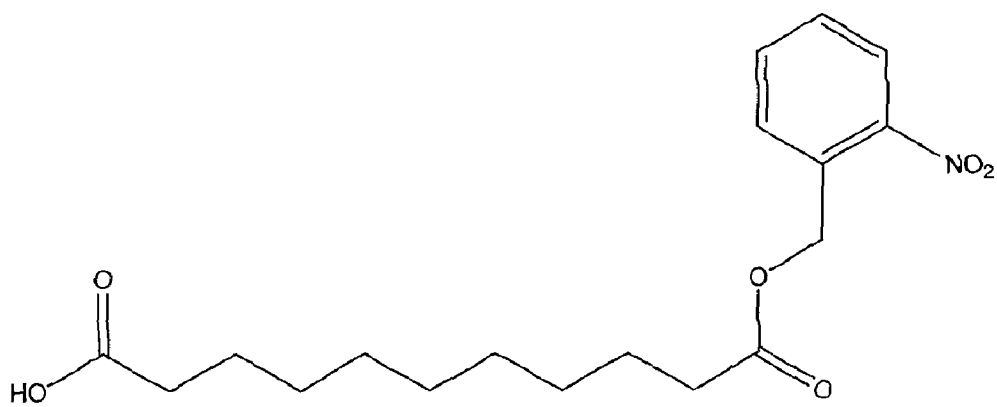
Figure 6C:
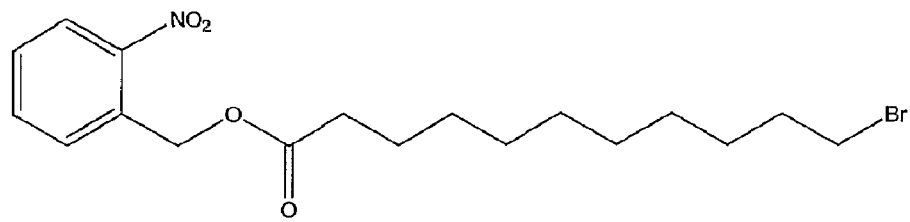
Figure 6C:
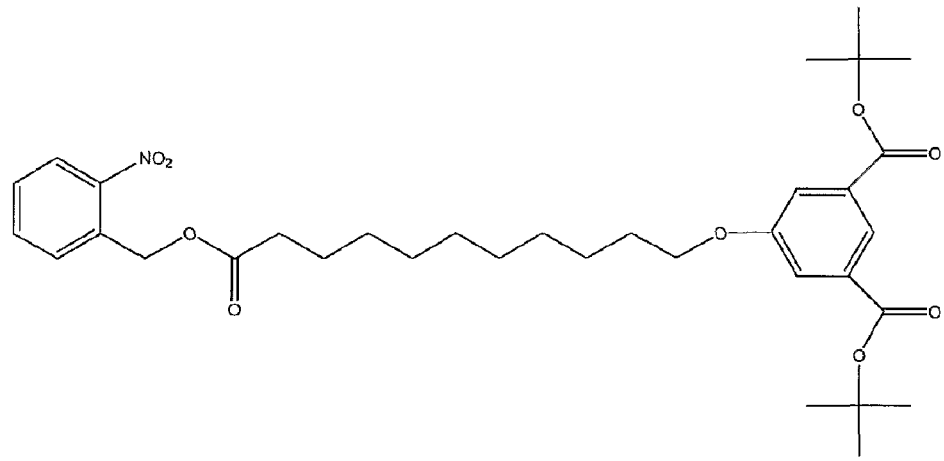
Figure 6C:
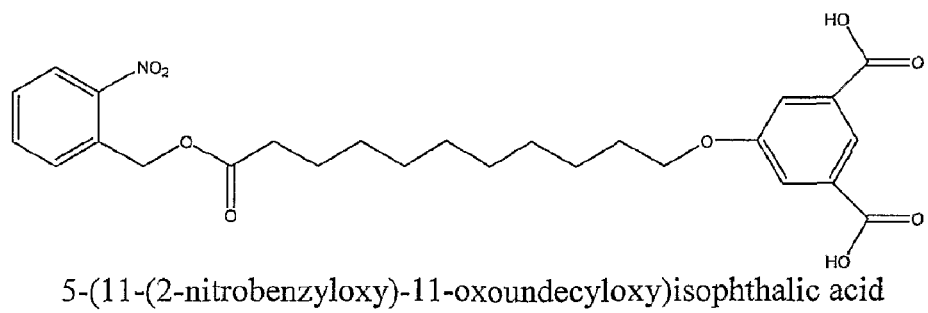

FIG. 5 schematically depicts an exemplary molecule 500 included in the films of the present invention. The molecule is attached to the substrate 505 by a linker, $R_4$, 510. In various embodiments, the substrate has a surface comprising at least one material selected from gold, silica and indium tin oxide. The linker can be any linker as described herein, and/or any linker that attaches at least one molecule to the surface of a substrate. For example, the linker can be, but is not limited to, a bond, —O—, —S—, —P—, —$CH_2$—, —$OSi(OR_6)_2$— or —$OSiCl_2$—. $R_6$ can be, but is not limited to, an alkyl. The linker may be covalently attached to a first layer forming unit, U, 520 via a first organic tethering molecule, $R_3$, 515. The first organic tethering molecule can be, but is not limited to a bond, an alkyl, alkenyl, alkynyl, halogen, hydroxyl, alkylcarbonyloxy, arylcarbonyloxy, alkoxycarbonyloxy, aryloxycarbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, alkylsulfinyl, sulfonato, sulfamoyl, sulfonamido, nitro, trifluoromethyl, cyano, azido, heterocyclic, alkylaryl, an aromatic or heteroaromatic group, and combinations thereof. In various embodiments, the final layer forming unit, U, can be covalently attached to a capping group, $R_1$, 530 via a second organic tethering molecule 525. The capping group represents a functional or non-functional molecule. The capping group can, in various embodiments, be attached to one layer forming unit, or can be attached to more than one layer forming unit, depending, e.g., on the oxidation state of the metal(s) in each layer forming unit and the number of donor atoms in the capping group. Additionally, in various embodiments, one layer forming unit can be attached to more than one capping group.

In some embodiments, the non-functional capping molecule can be, but is not limited to, a hydrogen, an alkyl, alkenyl, alkynyl, halogen, hydroxyl, alkylcarbonyloxy, arylcarbonyloxy, alkoxycarbonyloxy, aryloxycarbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, alkylsulfinyl, sulfonato, sulfamoyl, sulfonamido, nitro, trifluoromethyl, cyano, azido, heterocyclic, alkylaryl, an aromatic and/or a heteroaromatic group.

In various embodiments, $R_1$ is a photochromic molecule. For example, $R_1$ can be, but is not limited to substituted or unsubstituted spiropyran molecules, substituted or unsubstituted spirooxazine molecules, dipyridyl containing molecules, 2,2'-dipyridylethylene, substituted or unsubstituted chromene molecules, substituted or unsubstituted spirodihydroindolizine molecules, and/or substituted diazine molecules.

In various embodiments, $R_1$ is a photovoltaic molecule. The photovoltaic molecule can be, but is not limited to pyridine, pyrene, perylene, naphthaline, anthracene, or other fused aromatics, porphyrins, substituted porphyrins, dicarboxypyridine substituted tetraphenylporphyrin, mono-, di-, tri-, tetraphenyl porphyrins, benzoporplihyrins, mono-, di-, tri-, tetraphenylbenzoporphyrins, phthalocyanines, rhodamine dyes, methyl viologen, substituted methylviologens, quinones, substituted quinones, EDTA or other tertiary and secondary amines, and/or aromatics containing alkoxy groups.

In various embodiments, $R_1$ is an analyte sensing molecule. The analyte sensing molecule can include, but is not limited to a fluorophore component and an ionophore component. In various embodiments, the ionophore includes at least one ionophore selected from a crown ether and an aza crown calixarene. In various embodiments, the fluorophore portion includes at least one fluorophore selected from anthracene, 4,4-difluoro-4-boro-3a,4a-diaza-s-indacene, tetramethylrosamine, aminohodamine B, N-methyl-4-hydrazino-7-nitrobenzofuran, nicotinamide adenine dinucleotide (NAD), reduced NDA (NADH) and NAD phosphate (NADP).

In various embodiments, $R_2$ can represent a bond, an alkyl, alkenyl, alkynyl, halogen, hydroxyl, alkylcarbonyloxy, arylcarbonyloxy, alkoxycarbonyloxy, aryloxycarbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, alkylsulfinyl, sulfonato, sulfamoyl, sulfonamido, nitro, trifluoromethyl, cyano, azido, heterocyclic, alkylaryl, an aromatic or heteroaromatic group, and combinations thereof;

The molecule 500 can include comprise one, two, or more layer forming units 535, e.g., 3, 4, 5, 6, 7, 8, 9, 10, etc. Each layer forming unit can include additional organic tethering molecules, $R_{5a}$ and $R_{5b}$, 540 and 560. Additional organic tethering molecules can be any of the organic tethering molecules described herein. In general, organic tethering molecules may be selected depending upon their properties, e.g., length, steric bulk, hydrophobicity, hydrophilicity, etc. Such additional organic tethering molecules may be covalently bonded to ligands, $L_a$ and $L_b$, 545 and 555. Each occurrence of a ligand can be, but is not limited to an unsubstituted heterocyclic group coordinated to M, a substituted heterocyclic group coordinated to M, or a substituted aryl group coordinated to M (wherein the substituted aryl group is substituted with one or of more oxygen, nitrogen or oxygen and nitrogen containing substituents from the substituent group A). In various embodiments, substituent group A comprises an alkoxyl group, an amide group, an amino group, a carbonyl group, a carboxyl group, a hydroxyl group, and a heterocyclic group. In various embodiments, the ligands can include 2,6-dicarboxypyridine, pyridine, imidazole, and/or 1,3-dicarboxybenzene. The two ligands of each layer forming unit can be coordinated to a metal, M, 550. In various embodiments, M represents a transition metal atom substantially of oxidation state Y, a lanthanide metal atom substantially of oxidation state Z or a lead (Pb) atom substantially of oxidation state IV. In some embodiments, Y represents oxidation state I, II, III, IV, V, or VI. In some embodiments, Z represents oxidation state I, II, III, IV, V, or VI. In various embodiments, M is at least one metal selected from Cu(II), Co(II), Fe(III), Pb(II), and Pb(IV). In each layer forming unit, the metal, the ligands, and the organic tethering molecule may be the same or different than the metal, the ligands, and the organic tethering molecule in any of the other layer forming units. In some embodiments, the layer forming units form a regular repeating pattern. Furthermore, the dashed line represents the coordination of one or more donor atoms to M. It is to be understood that the metal-ligand bonds are illustrated by a single dashed line for ease of representation only. The number of metal-ligand bonds between the head group (e.g., $R_1$-$R_2$-$L_b$-$R_{5b}$) and metal atom (e.g., M) depend, for example, on the oxidation state of the metal atom M, and on the nature of the donor atoms (one electron, two electron, three electron, etc.). The ligands (e.g., $L_a$, $L_b$) of the layer forming unit can be a monodentate or multidentate ligand of a given metal atom.

Photoresponsive Wettability: Cap Layers Including A Photochromic Molecule

In various embodiments, the cap layer can include a photochromic molecule on the surface, thus providing photoresponsive wettability. In various embodiments, irradiation of the portion of the film that includes a photochromic molecule with a first wavelength of light photoconverts the photochromic molecules in the irradiated portions of the film from a first configuration to a second configuration. The second configuration providing a surface with wettability different than that provided by the first configuration.

In some embodiments, one configuration of the photochromic molecule provides a surface with a hydrophobic surface and another configuration of the photochromic molecule provides a surface with a hydrophilic surface. In some embodiments, the change in contact angle for water on the surface, between the first and second configurations is greater than about 10°, and more preferably greater than about 15°.

In various embodiments, methods of the present invention provide films having one or more regions having a substantially reversible photoresponsive wettability that are configured, e.g., for fluid manipulation, molecular separation and/or one or more of metal centered redox chemistry or heterogeneous catalysis.

In various embodiments, the present invention provides molecular films where irradiation of the film with a first wavelength of light photoconverts the photochromic molecules in the irradiated portions of the film from a first configuration to a second configuration. The second configuration generally provides a surface with a wettability different than that provided by the first configuration.

Changes in wettability can arise from one or more changes in the surface properties of the molecular films of the present invention. For example, changes in wettability can arise from changes in dipole moment between configurations of the photochromic molecules, thus leading, e.g., to changes in surface free energy and wettability. Changes in dipole moment can arise from a number of process including, for example, isomerization (e.g., cis-trans isomerization), electron transfer, intramolecular hydrogen transfer, intramolecular group transfer, pericyclic reactions (e.g., electrocyclizations, and cycloadditions), and dissociation processes. Multiple processes can occur in a single photo conversion. Processes that change charge localization within the photochromic molecule can also have an impact on the dipole moment.

In addition to dipole moment changes, changes in the coordination of the photochromic molecule to the metal atom, M, (arising, e.g., from conformational changes and/or rearrangements of the photochromic molecule) can result in increased or decreased ability of the metal atoms to interact with substances on the surface of the film.

Photochromic molecules suitable for use in various embodiments of the cap layers of present invention include spiropyrans, spirooxazines, dipyridyls, chromenes, spirodihydro-indolizines, diazenes, and combinations thereof.

Spiropyran compounds and spirooxazines are photochromic in that exposure of the spiropyran configuration to UV light can cause a transformation to the merocyanine configuration, while exposure of the merocyanine configuration to visible wavelengths of light can cause reversion to the spiropyran configuration. The spiropyran and spirooxazine photochromic systems can be deposited as photochromic molecules in the spiropyran and the merocyanine configurations since, for example, there are donor atoms, e.g. oxygen and nitrogen, suitable for coordination with the metal atom, in both configurations. Further suitable donor atoms can be provided, for example, by substitution of the 8 position with group containing an oxygen and/or nitrogen containing group, such as, for example, an amide, an alkoxy, a carbonyl, a carboxylate, a alkylcarbonyl, alkylcarbonyloxy, heterocyclic, etc.

The position numbering used herein for a spiropyran or spirooxazine is shown below.

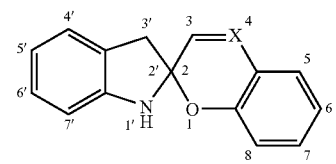

X = carbon for a spiropyran;
X = oxygen for a spirooxazine.

The identities of R (at the 8 position) and R' (at the 1' position) in a benzo indolino pyrano spiran (such as, for example derivatives of 1',3',3'-trimethylspiro(2H-1-benzopyran-2,2'indoline)) can have an effect on the formation of complexes. Bulky groups on the nitrogen atom (R') can potentially prevent coordination of the spiropyran configuration through the nitrogen of the furan. In various embodiments, the photochromic molecule comprises a 6-nitro-1',3', 3'-trimethylspiro(2H-1-benzopyran-2,2'indoline) or 1',3',3'-trimethylspiro(2H-1-benzopyran-2,2'indoline) substituded at the 8 position with a group R, and the 1' position with group R'; where R is methoxy, ethoxy, n-propoxy, or carboxylate, and R' is methyl, ethyl, n-propyl, n-butyl, carboxylate, or a carboylate at the end of a $C_0$-$C_{10}$ alkyl chain. In various embodiments, the photochromic molecule comprises a 6-nitro-1',3',3'-trimethylspiro(2H-1-benzopyran-2,2'indoline) substituted with an aromatic ring at the 4,5; 5,6 or 6,7 positions.

The metal atom to which a spiropyran or merocyanine configuration of a spiropyran or spirooxazine is coordinated can also effect the equilibrium between the two forms. For example, coordination of 6-nitro-1',3',3'-trimethylspiro(2H-1-benzopyran-2,2'indoline) to a lanthanide metal typically shifts the equilibrium from the spiropyran to the merocyanine configuration. This complex formation is accompanied by a blue-shift in the absorption spectrum of the merocyanine form.

In various embodiments, the methods of the present invention provide molecular films where the photoconversion between configurations of the photochromic molecule is substantially reversible by irradiation with light. Examples of photochromic molecules that, in various embodiments, can provide substantially reversible photoresponsive wettability include spiropyrans, spirooxazines, and substituted stilbenes. In various embodiments, substantially monolayer thick films with substantially reversible photoresponsive wettability can be achieved in several ways, including but not limited to photoinduced interconversion between two or more members of a photochromic system where the interconverted configurations remain botnd on the surface of the film and/or where one of the configurations detaches from the surface.

In various other embodiments, the methods of the present invention provide molecular films where the photoconversion is substantially irreversible by irradiation with light. In various embodiments, substantially monolayer thick films with substantially irreversible photoresponsive wettability can be achieved in several ways, including, but not limited to, instances where, although photoconverted configuration remains attached to the metal atom, solvation of the metal atom substantially prevents reversion to the original configuration and/or instances where the photoconverted configuration detaches from the surface and e.g., forms a complex with a species in solution with a binding energy greater than that between the metal atom and either of the photochromic system configurations.

Creating Current: Cap Layers Including A Photovoltaic Molecule

In various embodiments, the head group layer can include a photovoltaic molecule on the surface, thus providing a layer able to create a current upon exposure to light. Photovoltaic molecules of the present invention, in various embodiments, include chromophores, photooxidants, and photoreductants.

The photovoltaic effect is the physical process through which photovoltaic molecules convert light into electricity. Light, e.g., sunlight, is composed of photons which contain different amounts of energy that correspond to their respective wavelengths. In various embodiments, when a photon of sufficient energy strikes a valence electron on a photovoltaic molecule of the present invention, the photon can transfer enough energy to excite the electron thus allowing it to be transferred to other molecules in the film. The electron, after excitation, is then free to travel, the motion of the electron creating a current.

Additionally, in various embodiments, the molecule abandoned by the electron would then include a net positive charge in the form of the generated "hole". Electrons from other excited photovoltaic molecules or other molecules in the film, e.g., metal ions, are able to move into the hole. This effective movement of a "hole" can also create a current.

In various embodiments, the photovoltaic molecules included in various embodiments of devices of the present invention provide enough current to power one or more features or functions of the device.

In various embodiments, chromophores include, but are not limited to pyridine, pyrene, perylene, naphthaline, anthracene, or other fused aromatics, porphyrins, substituted porphyrins, dicarboxypyridine substituted tetraphenylporphyrin, mono-, di-, tri-, tetraphenyl porphyrins, benzoporphhyrins, mono-, di-, tri-, tetraphenylbenzoporphyrins and/or phthalocyanines along with other chromophores having appropriate photooxidation/phototreduction behavior. Photooxidants include, but are not limited to compounds such as methyl viologen, substituted methylviologens, quinones, substituted quinones and molecules having small negative reduction potentials as determined form the Gibbs free energy change determined from the Rehm-Weller equation. Photoreductants include, but are not limited to compounds such as EDTA or other tertiary and secondary amines, aromatics containing alkoxy groups or other molecules having small positive oxidation potentials per the Relun-Weller equation.

In various embodiments, a rigid link is maintained between the porphyrins and the ligand so that the porphyrins stick up from the surface. Such a structure is advantageous in some embodiments, because without a rigid link, the porphyrins can position themselves substantially flat against the surface and prevent any further layers from assembling.

Detection of Analytes: Cap Layers Including an Analyte Sensing Molecule

In various embodiments, the cap layer can include an analyte sensing molecule on the surface, thus providing a layer for detection of analyte. The detection of analytes combines electrochemical and optical measurement of the analyte-ionophore interaction to provide two different measurements of analyte presence and/or concentration from two different transduction mechanisms provided by the same molecular species, i.e., the analyte sensing molecules having the same fluorophore, analyte binding and linker portions.

In various embodiments, signal transduction in the fluoroionophore is modulated by the photoinduced electron transfer (PET) mechanism. For example, analyte complexation within the binding site of a aza-crown-5 calix[4]arene analyte binding portion suppresses electron transfer to an excited fluorophore and thereby increases the fluorescence intensity, which can be related to the analyte concentration or activity.

A variety of techniques can be used to measure changes in fluorescence arising from the binding of an analyte to the analyte binding portion. In various embodiments, the fluorescence signal intensity is measured. Preferably, one or more bandpass and/or cut-off filters are used to reduce stray light. In various embodiments, the excitation light is modulated and the fluorescence detected by phase sensitive (e.g., phase-locked) detection to facilitate reducing the influence of stray light on the measurements. In various embodiments, changes in fluorescence are measured by measuring the fluorescence lifetimes to facilitate reducing the influence of stray light on the measurements.

Fluorescence intensity measurements are not absolute and should be compared with a standard reference material for calibration. Laser dye with high quantum yields and photochemical stability (e.g., 1,4-Di[2-(5-phenyloxazolyl)benzene]POPOP) are preferred fluorescence intensity standard reference materials.

A variety of electrochemical techniques can be used to measure electrochemical signals arising from the binding of an analyte to the analyte binding portion including, but not limited to, cyclic voltammetry, impedance, capacitance, amperometric, coulombic, AC analysis, and potentiometric measurement techniques. In preferred embodiments of an analyte sensor, microfluidic device or method of the present invention for a medical device, potentiometry is the preferred technique. Potentiometric measurements can also be performed under zero current conditions such that substantially no electrochemistry takes place at the electrode surface.

For example, a potentiometric measurement where the half cell can be represented as:

electrically conductive material |analyte binding portion|sample which can be completed, e.g., with a standard reference electrode. In various embodiments, a microfluidic device of the present invention includes a standard reference electrode (e.g., an Ag/AgCl reference electrode) and a counter electrode (e.g., platinum).

In various aspects, the present invention provides an analyte sensor comprising an analyte sensing molecule comprising an analyte binding portion and a fluorophore portion.

(a) Analyte Binding Portion

Preferably, the analyte binding portion of the sensing molecule is substantially selective for the analyte of interest, e.g., an ionophore where the analyte of interest is an ion. In various embodiments, the analyte binding portion is selective over interferants of concern in a sample by a factor of greater than about 100, and preferably greater than about 1000. In various embodiments, binding portion is selective over interferants of concern in a sample by a factor of greater than about 1000. For example, the typical blood concentration of sodium ions is about 150 mM. For a sensor that is 100 times more sensitive to lithium ions than sodium ions the detection limit of the device for lithium ions is 1.5 mM.

The selectivity of an ionophore for one analyte relative to another, for example, can be evaluated from the selectivity coefficient ($K_{ij}^{Pot}$). Selectivity coefficients can be determined by several methods, such as the Fixed Interference Method (FIM) and Separate Solution Method as described in, for example, E. Baker et al. *Chem. Rev.* 104, pp. 3083-3132, (1997) the entire contents of which are herby incorporated by reference. A variety of structures can be used as analyte binding portions in the analyte sensing molecules of the present invention. In various embodiments, analyte binding portions comprise crown ethers, e.g., aza crown calixarenes, which comprise a convenient attachment site for a fluorophore (or other chromophore) portion via the secondary amine. For example, 14-crown-4 ether, 3-dodecyl-3-methyl-1,5,8,12-tetraoxacyclotetradecane and N-(9-methyl-anthracene)-25,27-bis(1-propyloxy)-4-p-tert-butylcalix[4]arene-azacrown-3 are crown ether analyte binding portions, suitable for detecting the presence and/or concentration of lithium ions. Additionally, in various embodiments, bis(benzo-15-crown-5) ether analyte binding portions are suitable for detecting the presence and/or concentration of sodium ions and bis(12-crown-4) ether analyte binding portion are suitable for detecting the presence and/or concentration of potassium ions. Other analyte binding portions include cyclodextrans, segments of specific ribose nuclic acids (RNAs) and deoxyribose nucleic acids (DNAs) and cyclic peptides.

Another consideration in selecting an analyte binding portion is the availability of an electron donor group (e.g., a secondary amine) through which to link the analyte binding portion to the fluorophore portion of the analyte sensing molecule.

(b) Fluorophore Portion

Selection of fluorophore portions can, e.g, be based on fluorescence transition lifetime, shorter lifetime fluorescence transitions typically providing greater intensity and being less sensitive to lifetime reductions via interactions with, e.g., oxygen. For example, for air saturated aqueous solutions, the effect of oxygen on a fluorescence lifetime of about 50 ns is less than about 1%. For species with shorter lifetimes the effect is less.

Consideration can also be given to the basic photophysical process by which such molecules fluoresce, i.e., photoinduced electron transfer (PET) where fluorescence is modulated by an intramolecular electron transfer quenching mechanism in which the excited state of the fluorophore is quenched by electron transfer from an electron donating group in the fluoroionophore. A thermodynamic prediction of the feasibility of electron transfer can be made by calculating the free energy of the process using the Rehm-Weller equation:

$$\Delta G_{PET} = E_{oxd/D} - E_{red/A} - \Delta E_{00} - e^2/4\pi \in r \qquad (1),$$

where $E_{oxd/D}$ is the oxidation potential of the electron donor, $E_{red/A}$ is the reduction potential of the electron acceptor, $\Delta E_{00}$ is the energy of the excited state that participates in the electron transfer process, usually a singlet state, and the final term is the Coulombic energy of the ion pair where e is the electron charge, $\in$ is the dielectric constant of the solvent and r is the distance between the two ions.

Examples of suitable fluorophores include, but are not limited to, anthracene, xanthene dyes, 4,4-difluoro-4-boro-3a,4a-diaza-s-indacene, tetramethylrosamine, and anlogs and derivatives thereof. Examples of suitable fluorophores for a monocylic depsipeptide ionophore for ammonium ions include, but are not limited to, aminohodamine B, and N-methyl-4-hydrazino-7-nitrobenzofuran.

In various embodiments, analyte sensing molecules suitable for use in the present invention include, but are not limited to compounds which include an anthracene fluorophore portion, an aza-crown-5 calix[4]ene analyte binding portion.

Metal Atom Component

A wide variety of metals, and oxidation states thereof, can be used in the methods and devices of the present invention. In general, the metal atom provides a means to non-covalently link substantially monolayer thick films.

Suitable metal atoms for the metal atom component include transition metals having oxidation states of I, II, III, IV, V, or VI, lanthanide metals having oxidation states of I, II, III, IV, V, or VI, and lead (Pb) having an oxidation state of IV. For example, first row transition metals, such as titanium (Ti), vanadium (V), chromium (Cr), manganese (Mn), iron (Fe), cobalt (Co), nickel (NI), copper (Cu) and zinc (Zn) can be used. Examples of preferred oxidation state two metal atoms include Mn(II), Co(II), Cu(II), and Zn (II). In various embodiments, metal atoms with oxidation states that form substantially octahedral complexes are preferred, for example, to provide better packing. Examples of preferred oxidation state three metal atoms include Fe(III), and examples of preferred oxidation state four metal atoms include Ti(IV) and Pb(IV).

Organic Tethering Molecules

In various embodiments, the organic tethering molecule component preferably comprises a molecule capable of forming a self-assembled monolayer on the surface of the substrate to be coated with a film of the present invention. The organic tethering molecule can comprise a wide variety of compounds and groups. For example, when an analyte sensing molecule is desired as the head group, the linker portion can be chosen such that its absorption of light, if any, does not detrimentally interfere with the excitation and/or fluorescene of the fluoresence transition of interest of the fluorophore. For example, conjugated molecules can have absorption peaks in regions in which certain fluorescence transitions occur. In addition, in various embodiments, the linker is preferably chosen to facilitate increasing the packing of the head groups on the surface.

The first organic tethering molecule can be, but is not limited to a bond, an alkyl, alkenyl, alkynyl, halogen, hydroxyl, alkylcarbonyloxy, arylcarbonyloxy, alkoxycarbonyloxy, aryloxycarbonyloxy, carboxylate, alkylcarbonyl, arylcarbonyl, alkoxycarbonyl, aminocarbonyl, alkylaminocarbonyl, dialkylaminocarbonyl, alkylthiocarbonyl, alkoxyl, phosphate, phosphonato, phosphinato, cyano, amino (including alkyl amino, dialkylamino, arylamino, diarylamino, and alkylarylamino), acylamino (including alkylcarbonylamino, arylcarbonylamino, carbamoyl and ureido), amidino, imino, sulfhydryl, alkylthio, arylthio, thiocarboxylate, sulfates, alkylsulfinyl, sulfonato, sulfamoyl, sulfonamido, nitro, trifluoromethyl, cyano, azido, heterocyclic, alkylaryl, an aromatic or heteroaromatic group, and combinations thereof. In various embodiments, organic tethering molecules comprise a substituted or unsubstituted $C_1$-$C_{20}$ alkyl group, or a substituted or unsubstituted $C_1$-$C_{20}$ alkyl group wherein one or more of the carbon atoms of the alkyl backbone are replace with one or more of oxygen, nitrogen, sulfur, and phosphorous, a peptide chain (e.g., a helical peptide chain), and combinations thereof.

Ligands

In various embodiments, the ligands used in the methods and devices of the present invention include, but are not limited to, carboxylic acid groups and/or heterocyclic or substituted aryl groups comprising one or more oxygen atoms, nitrogen atoms, or both, which can coordinate to the metal atom. Examples of ligands include, but are not limited to substituted and unsubstitLted: carboxylic acids, furans, imidazoles, pyrimidines, pyrroles, dicarboxypyridines (preferably 1,3 dicarboxypyridines), dicarboxybenzenes (preferably 1,3 dicarboxybenzenes), oxazines (preferably 1,3 oxazines), dicarboxyfurans (preferably 2,5 dicarboxyfurans), dicarboxypylroles (preferably 2,5 dicarboxypyrroles), diaminepyridines (preferably 1,3 diaminepyridines), diaminebenzenes (preferably 1,3 diaminebenzenes), diaminefurans (preferably 2,5 diaminefurans), diaminepyrroles (preferably 2,5 diaminepyrroles), amino-carboxypyridines (preferably 1,3 and 3,1 aminocarboxypyridines), amino-carboxybenzenes (preferably 1,3 and 3,1 aminocarboxybenzenes), amino-carboxyfurans (preferably 2,5 and 5,2 aminocarboxyfurans), and amino-carboxypyrroles (preferably 2,5 and 5,2 aminocarboxypyrroles).

In various embodiments, the ligand comprises one or more of a primary amine, a thiol alcohol, a phosphate, a phosphonate, a sulfonate, any oxygen, nitrogen, sulfur, or phosphorous containing substituents as described herein, and combinations thereof.

Linker Groups

In various embodiments, e.g., when the substrate comprises one or more of a polymer, plastic, or ORMOSIL gel, the coupling group component (e.g., $R_4$) comprises one or more of: —OR, —SH, —NH$_2$, —SO$_2$OR, —PO(OR)(OR), -carboxylates, substituted pyridines, unsubstituted imidazoles, substituted imidazoles,

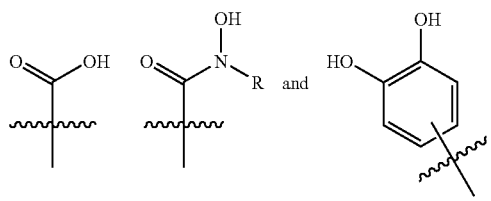

where R and R' independently represent a hydrogen, or a substituent as described herein.

Examples of coupling groups for attachment of the linker portion to a glass, ORMOSIL gel, and/or metal oxide surface include, but are not limited to, SiX$_3$ or Si(OR)$_3$, where X=Cl, Br, or I, and R=alkyl. For alumina, metal oxide, quartz, glass (SiO$_2$), silicon, and ORMIOSIL surfaces, coupling groups can be formed on such surfaces by chemical modification, e.g., to form —OSiCl$_2$—. For example, for polydimethyl siloxane (PDMS) substrates chemical surface modification can be achieved by forming siloxane linkages between the chemical layer deposited and Si—OH bonds on the PDMS surface (which can be created by base or oxidation treatment). Siloxane linkages can be created, e.g., by the reaction of trichlorosilyl- or trialkoxysilyl-functionalized molecules with the surface Si—OH groups. This siloxane chemistry operates with nearly any surface-bound hydroxyl group and is therefore applicable to a wide range of metal oxide substrates, including indium tin oxide (ITO), tin oxide, fluorine-doped tin oxide, tin oxide, and zinc oxide, and the alumina surfaces. Chemical modification of silicon surfaces for attachment of organic molecules is well known and call be used if silicon surfaces are to be coated.

Examples of coupling groups for attachment of the linker portion to various electrically conductive materials include thiolates for gold surfaces (a sulfur atom serving as a surface coupling group); and phosphonates for GaAs and GaN surfaces (a phosphorous atom serving as a surface coupling group); and SiX$_3$ or Si(OR)$_3$ for glass, ORMOSIL gel, and metal oxide surfaces, where X=Cl, Br, or I, and R=alkyl. In general, for non-oxidized metals (e.g., gold, silver, platinum, etc.), organic tethering components can be deposited through the formation of dative bonds between the metal atoms on the surface and thiol or disulfide groups in the molecules to be deposited.

Substrates

A wide variety of substrates can be used in the various aspects of the present invention. A substrate can be, e.g., rigid or flexible. Examples of rigid substrates include, but are not limited to, gold, silica, quartz, glass (SiO$_2$), and silicon wafers. Examples of flexible substrates include, but are not limited to, ORMOSIL gels, polyethylene terephthalates (PETs), polyimides, polyethylene naphthalates (PENs), polymeric hydrocarbons, cellulosics, combinations thereof, and the like. PET and PEN substrates may be coated with one or more electrical conducting, oxide layer coatings of, for example, indium tin oxide (ITO), a fluorine-doped tin oxide, tin oxide, zinc oxide, and the like.

In various embodiments, substrate materials for use with an analyte sensing molecule can be substantially transparent to the excitation wavelength and the fluorescence wavelength of the fluorophore fluorescence transition of interest. In various embodiments, the substrate materials are not substantially transparent to the excitation wavelength and the fluorescence wavelength of the fluorophore fluorescence transition of interest, e.g. where the excitation and fluorescence light are not being coupled, into and out of the analyte sensor through the substrate.

In various embodiments, e.g., in films that include analyte binding molecules, electrically conductive material can be used as a substrate. Examples of electrically conductive materials include, but are not limited to, metal oxides, such as, e.g., indium tin oxide (ITO), fluorine-doped tin oxide, tin oxide, and zinc oxide, and the like. The electrically conductive material is preferably chosen such that it does not quench the excited state of the fluorescence transition of interest.

Micro- and Nanofluidic Devices

In various aspects, the present invention also provides multilayer thick molecular films, which generally include a substrate having a surface; a cap layer covering at least a portion of the surface; the cap layer comprising at least one molecule of a photochromic molecule, a photovoltaic molecule, and an analyte sensing molecule; and a linker portion connecting the cap layer to the surface, wherein said linker portion comprises at least two layers and wherein the layers of the linker portion are retained on the surface by substantially non-covalent interactions.

The thickness of the films of the present invention, over the region of interest on a substrate, is believed, without being held to theory, to be important as a substantially uniform surface can be provided by the methods of the present invention. Thus, in various embodiments, areas of relatively well defined wettability can be provided, which facilitate, for example, the use of the films of the present inventions in micro- and nanofluidic devices. In addition, in various embodiments, the methods and films of the present invention can provide articles (e.g., beads or other structures coated with a molecular film of the present invention) having a relatively large surface area to volume ratio. The attributes of the devices of the present invention, e.g., photoresponsive wettability, ability to detect analytes, and ability to generate a current, in various embodiments, can facilitate providing surfaces for, e.g., redox chemistry, catalysis chemistry, etc. that can be controlled by, initiated by, terminated by, modultated by, etc. (or in general responsive to) irradiation with light.

A variety of techniques exist to assess the properties of a film on a surface, e.g., grazing-angle Fourier transform infrared spectroscopy (grazing-angle FT-IR), quartz crystal gravimetry, atomic force microscopy (AFM), scanning electron microscopy (SEM), cyclic voltametry, contact angle measurements, and ellipsometry. For example, AFM and ellipsometry can give a relatively direct measure of the thickness of a film. AFM and ellipsometry are preferred methods for determining the thickness of the molecular films of the present invention, and, e.g., a region of a film is considered to be a monolayer thick if one or more of these AFM and ellipsometry methods indicate that the film is a monolayer thick to a reasonable degree of certainty. Surface coverage and density can be estimated by combining the results of ellipsometry and quartz crystal gravimetry.

Accordingly, in various aspects, the present invention provides one or more devices that include any of the films described herein. For example, the device can include a substrate having a surface; a photovoltaic layer covering at least a portion of the surface; the photovoltaic layer comprising at least one photovoltaic molecule; a photochromic layer covering at least a portion of the surface, the photochromic layer comprising at least one photochromic molecule; and/or an analyte sensing layer covering at least a portion of the surface, the analyte sensing layer comprising at least one analyte sensing molecule; and one or more linker portions connecting each photovoltaic molecule, photochromic molecule, and analyte sensing molecule to the surface; wherein at least one linker portion comprises at least two layer forming units.

In various aspects, the present invention provides a nanopatterned device comprising a microchannel structure, the microchannel structure having one or more fluid control regions, and one or more analyte sensing regions in fluid communication with the one or more fluid control regions. In various embodiments, at least one of the fluid control regions directs the flow of fluid to at least one of the analyte sensing regions. In various embodiments, the fluid control region is an active fluid control region. In various embodiments, the fluid control region includes one or more photochromic layers on the film, which have been adapted to transport a solution to the analyte sensing layer. In various embodiments, the fluid control region includes one or more photochromic layers on the film, which have been adapted to act as a valve, a mixer, or a device which diverts liquid from one channel to a second channel. In various embodiments, different areas of the fluid control region can be adapted for different functions. For example, in various embodiments, a fluid control region can include an area for mixing two liquid samples, a valve which opens after a desired mixing time, and an area which transports the mixed sample to an analyte sensing layer, e.g., to determine if the two samples produced a reaction.

In various embodiments, the device also includes one or more photovoltaic regions. In various embodiments, the photovoltaic region of the device is adapted to provide current to another portion of the device, e.g., the analyte sensing region. In various embodiments, the photovoltaic region is adapted to provide a current to a conductive metallic layer in order to heat the conducting material, and thus the contents of a particular area of the device. The size and nature of the metallic layer can be adjusted upon formation of the film so as to provide the desired level of heating for a given application. In various embodiments, the photovoltaic region is used in the analytical functioning of the device, e.g., in electrophoresis.

Figure 7:
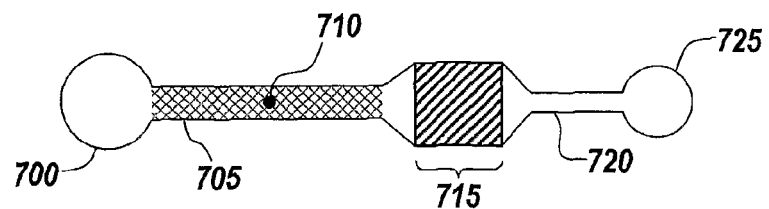
FIGS. 7-10 schematically illustrate various embodiments of devices comprising imagewise films of the present invention.

Referring to FIG. 7, in various embodiments, a simple structural element of a nanopatterned microfluidic device includes an inlet port 700 for a liquid, an analyte sensing region 715 in fluid communication with the inlet port via a fluid control region 705. The fluid control region is adapted for fluid control, e.g., by having one or more compounds on the surface of the region with photoswitchable wettability 710. The device can further include an outlet port 725 in fluid communication with the analyte sensing region via a second fluid control region or a flow conduit 720.

In various aspects, the present invention provides a nanopatterned device comprising two or more fluid control regions; one or more analyte sensing region; and one or more flow conduits connecting the fluid control regions with the analyte sensing regions. In various embodiments, the flow conduits connect the fluid control regions together prior to connecting to the analyte sensing region. In various embodiments, the device also includes a mixing region, capable of mixing the contents of the two or more control regions prior to exposure to the analyte sensing region. In various embodiments, the mixing region includes one or more photochromic layers.

Figure 8:
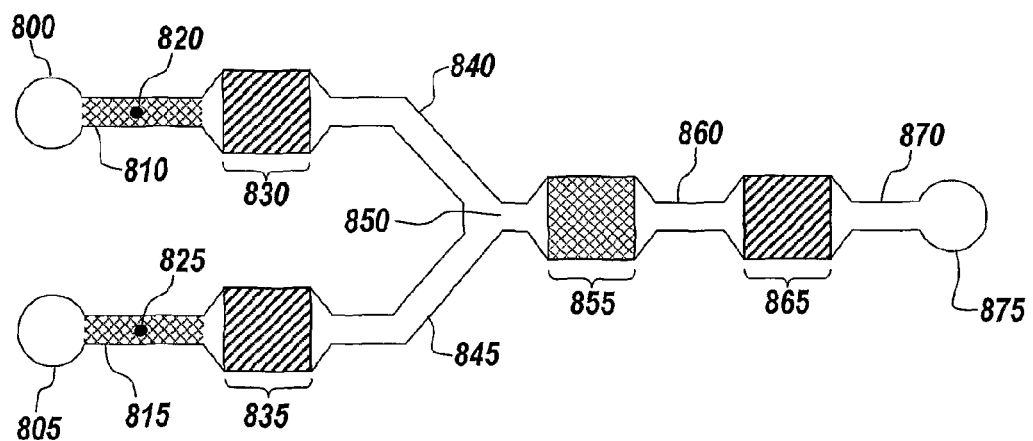

Referring to FIG. 8, in various embodiments, nanopatterned microfluidic devices are provided, the devices having two inlet ports 800, 805 for two liquids, which ports are in fluid communication with two analyte sensing regions 830, 835, via two fluid control regions 810, 815. The fluid control regions are adapted for fluid control, e.g., by having compounds on the surface of the region with photoswitchable wettability 820, 825. That is, in various embodiments, the fluid control regions include, e.g., valves which comprise areas which are hydrophobic upon entry of liquids into the inlet ports, effectively blocking liquid progress to the analyte sensing region(s). Upon exposure to a specified wavelength of light, the compound becomes hydrophilic, thus allowing passage of the liquid to the analyte sensing region. In various embodiments, the devices further comprise a junction 850 in fluid communication with both analyte sensing regions via flow conduits 840, 845. The flow conduits, in various embodiments, function by capillary action. In other embodiments, the flow conduits are fluid control regions, e.g., regions with photoswitchable wettability. In various embodiments, the devices further include a mixing region 855. In various embodiments, the mixing region includes one or more compounds with photoswitchable wettability, which are switched between hydrophobic and hydrophilic forms via exposure to one or more photomasks in various patterns, or other designs of light. In various embodiments, the mixing region includes at least two compounds with photoswitchable wettability arranged in a regular or irregular pattern, which are activated by two different wavelengths of light. Without wishing to be bound by any particular theory, it is believed that maintaining two liquids in a region with a surface in which areas switch between hydrophobic and hydrophilic forms, the liquids will remain in motion, thus effectively mixing them. In various embodiments, the devices can be used for, e.g., solvation, reaction. The reaction can be, for example, separation, e.g., electrophoresis. In various embodiments, the devices further include an additional analyte sensing region 865 in fluid communication with the mixing region via an additional flow conduit 860. The flow conduit, in various embodiments, can function by capillary action, or can be fluid control regions. Additionally, in various embodiments, the flow conduit can include a valve, e.g., to prevent the progression of sample into the analyte sensing region before a specified mixing time. In various embodiments, the devices can further include an outlet port 875 in fluid communication with the analyte sensing region via an additional flow conduit 870.

Figure 9:
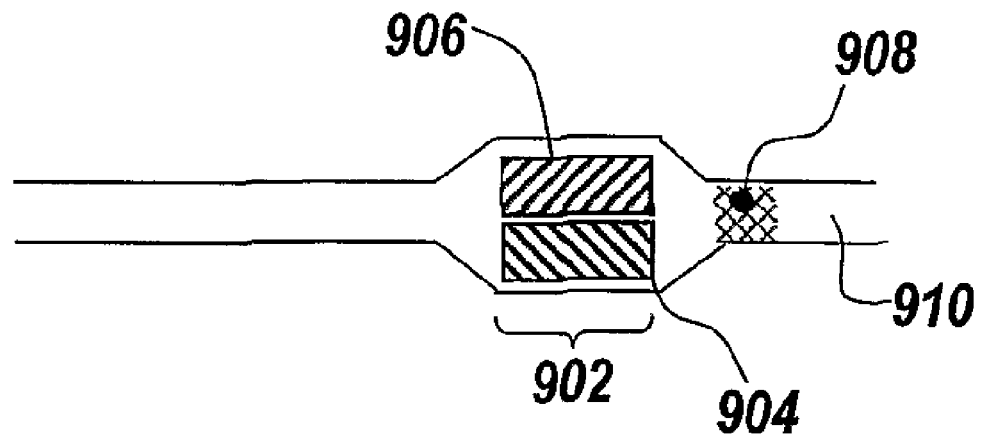

In various embodiments, one or more analyte sensing regions can be used to regulate fluid flow. Referring to FIG. 9, in various embodiments a reaction region 902 of a device comprises one or more analyte sensing regions 904, 906 and the wettability of a region with photoswitchable wettability 908 is maintained or changed in response to a signal from one or more of the analyte sensing regions 904, 906. For example, in various embodiments, the photo switchable wettability region 908 acts as a valve which is closed, (e.g. preventing fluid flow into the downstream fluid conduit 910) until one or more of the analyte sensing regions 904, 906 indicate that reaction has reached a desired level of completion. Upon reaching the desired level of completion is reached, the valve 908 is opened permitting fluid to flow into the downstream fluid conduit 910.

Figure 10:
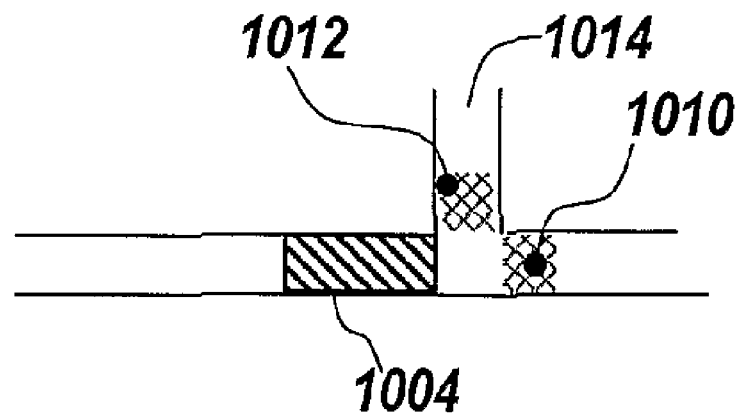

Referring to FIG. 10, in various embodiments, one or more analyte sensing regions 1004 disposed in a fluid conduit, for example, can be used to detect one or more analytes and open and/or close valves comprising photo switchable wettability regions 1010, 1012, thereby directing fluid flow. For example, in various embodiments, an analyte sensing region AA04 may detect an analyte A. In response to the detection of analyte A, one or more of the photo switchable wettability regions 1010 and 1012 are irradiated with light to close the valve 1010 and open the valve 1012; thereby directing fluid flow into a side conduit 1014.

Devices of the present invention, in various embodiments, are useful for lab-on-a-chip-type applications. For example, a device, such as the one exemplified in FIG. 8, may be useful in determining the composition of two starting materials, contacting the two starting materials with each other, mixing them, and determining whether and to what extent a reaction has taken place. Accordingly, in various embodiments, devices of the present invention may include one or more microreactors per reaction channel and two or more reactant feed channels per reaction channel. In various embodiments, each of the microreactors comprise a surface defining a reaction cavity for carrying out a chemical reaction, an inlet port in fluid communication with the reaction cavity, and an outlet port in fluid communication with the reaction cavity. Any of the additional regions, as discussed herein, may also be included in the devices of the present invention, e.g, mixing regions, analyte sensing regions, and fluid control regions. In various embodiments, the reaction cavity has a volume of not more than about 10 ml, and in some applications, not more than about 3 ml, 1 ml, 100 μl, 10 μl or 1 μl. Accordingly, in various embodiments, the present invention is directed to methods for effecting a microscale chemical reaction. One or more reactants for a chemical reaction of interest are supplied to a microreactor comprising a surface defining a reaction cavity for carrying out a chemical reaction. The reactants reside in the reaction cavity under process conditions effective for the chemical reaction of interest for a time also effective for the chemical reaction of interest, and the reactants are thereby converted to one or more reaction products in the reaction cavity.

In various embodiments, fabrication of three-dimensional microfluidic devices permits a large number of microfluidic components to be integrated into a small space. For example, in various embodiments a compact, three-dimensional device for splitting a sample into a large number of aliquots is provided. These aliquots may then be used in various reactions, e.g., screening, followed by analysis on the same device. The ability to analyze aliquots of a single sample, in various embodiments, can also be useful in point-of-care (POC) analyte sensors, e.g., blood electrolyte sensors.

In various embodiments, a parallel processing microfluidic analytical device is constructed. The term "parallel processing" as used herein refers to multiple microfluidic systems on a given contiguous device wherein some or all of the systems are in fluid communication with one another. In various embodiments, multiple fluid inlets, outlets, and/or detectors are in communication with more than one microfluidic system on a given device. Accordingly, a variety of simultaneous analytical processes may be accomplished using a small number of control inputs or outputs.

In various embodiments, the devices of the present invention are useful in various separation techniques. For example, a device of the present invention can include a channel, e.g., a fluid control region, which directs a fluid sample to a separation area. The sample can then undergo separation, e.g., through a column-like material, e.g., alumina or silica gel. In various embodiments, the separation is effected by the normal flow through the channel, e.g., due to the surface free energy and/or wettability of the surface. In various embodiments, the separation is effected by forcing the liquid sample through the separation area, e.g., using pressure or a pump. In various embodiments, the separation technique used is electrophoresis. In various embodiments, the current for the electrophoresis is provided by a photovoltaic layer of the same device.

In various embodiments, the devices of the present invention are useful in tissue engineering. In the process of tissue engineering, scaffolds are prefabricated and seeded with cells by placing the scaffolds in a solution that includes the cells. The cells then diffuse into and attach to the scaffolds. Although the cells can readily attach to the outermost portions of the scaffold, the random motility and uneven distribution of cells in solution may produce a non-uniform surface of cells throughout the scaffold. Furthermore, spatial gradients of cells may also be important in tissue engineering, e.g., the creation of a heterogeneous cellular system (e.g., a functioning arm with muscle, tendon, cartilage, nerve, skin, and vasculature), would require spatial control over cells. The microfluidic devices of the present invention can be fabricated as scaffolds to deliver specific cellular material in solution to specific areas. This control of fluid motion would allow a substantially constant exposure of cells to a desired area, as well as the ability to direct specific cells to varying desired areas.

The foregoing and other aspects, embodiments, and features of the invention can be more fully understood from the following description in conjunction with the accompanying drawings. In the drawings like reference numerals generally refer to like features and structural elements throughout the various figures. The drawings are not necessarily to scale, emphasis instead being placed upon illustrating the principles of the invention.

EXAMPLES

The present invention will be more fully described by the following non-limiting examples.

Materials and Methods

All chemicals and solvents used in the examples were reagent grade or better and used as received. 2-nitrobenzyl alcohol, 11-mercaptoundecanoic acid, undecanedioic acid, 1,3-dicyclohexylcarbodiimide (DCC), undecylenic acid, trichlorosilane, hydrogen hexachloroplatinate (IV) hydrate 5-hydroxyisophthalic acid, thionyl chloride, potassium tert-butoxide, anhydrous tetrahydrofuran (THF), 11-bromoundecanoic acid, potassium carbonate, lead (IV) acetate, sodium sulfate, sodium bicarbonate, potassium chloride, and potassium ferricyanide were from Aldrich (Milwaukee, Wis.).

4-(dimethylamino)-pyridine (DMAP) was from Avocado Research Chemicals (Lancashire, England). Ethanol (200 proof, absolute) for all experiments was obtained from Pharmco Products (Brookfield, Conn.). Trifluoroacetic acid and silica gel (40 μm, 60 Å) for column chromatography were obtained from J. T. Baker (Phillipsburg, N.J.).

Nuclear Magnetic Resonance

NMR spectra were obtained on a Bruker Avance 400 MHz spectrometer and referenced to tetramethylsilane (TMS). Spectra were recorded at 400 MHz for $^1$H and 100 MHz for $^{13}$C, and all chemical shifts (δ) are reported in ppm. Mass spectra were performed on a Waters Micromass model ZMD spectrometer using electrospray ionization and a 50:50 acetonitrile:water solvent flow by Synpep Corporation (Dublin, Calif.).

Fluorescence and UV/Visable Spectroscopy

Fluorescence measurements were performed on a Perkin Elmer model LS50B Luminescence Spectrometer. UV/Visible spectra were recorded on a Perkin Elmer Lambda 35 UV/Vis double beam spectrometer, and a baseline correction (solvent vs. solvent) was performed prior to each experiment. Transmission (bright-field) optical microscopy was performed on a Fisher Micromaster optical microscope with an integrated digital camera coupled to a computer running Micron software.

Cyclic Voltammetry

All electrochemistry experiments were carried out with an EG&G Princeton Applied Research Potentiostat/Galvanostat Model 273. The potentiostat was under computer control using Princeton's model 270/250 Research Electrochemical Software (v. 4.23). A three-electrode setup was used with the substrate (at various stages of coating) as the working electrode, a saturated calomel electrode (SCE) as the reference electrode, and platinum wire as the counter electrode. The monolayer was contacted with an alligator clip, and an area of 1 cm$^2$ was always kept immersed in the electrolyte solution. All solutions were freshly prepared and degassed with nitrogen before the experiments. The aqueous electrolyte solution used for the experiments was 1 mM potassium ferrocyanide with 0.10M potassium chloride as a supporting electrolyte. To limit noise and interference, the electrochemical cell was placed inside a Faraday cage. The cyclic voltammetry curves were obtained in the range of −0.3 to 0.7 V, with a scan rate of 50 mV/s and a scan increment of 1 V.

Impedance Spectroscopy

Impedance measurements were obtained using a Solartron 1255-HF frequency response analyzer coupled with the EG&G Princeton Applied Research Model 273 Potentiostat/Galvanostat. Princeton Applied Research's Power Sine software was used to control the instruments. Impedance experiments were performed using a three-electrode setup with the coated substrate as the working electrode (W.E.), a SCE as the reference electrode, and platinum wire as the counter electrode (C.E.). The electrolyte used was a 0.1 M solution of Na$_2$SO$_4$ in deionized water. The experiments were performed at a fixed potential of −0.5 V over a frequency range of 10 kHz to 100 mHz. The data was fit using a simple Randles equivalent circuit using non linear least squares fitting by the LEVMRUN software package.

Contact Angle Goniometry

Contact angle measurements were obtained using a Rame-Hart Model 100-00 Goniometer. Measurements were obtained using buffered solutions of pH 2 (0.1 M H$_2$SO$_4$) and pH 12 (0.1 M NaOH). 1 μL droplets were applied to the surface using a calibrated Epindorf pipette and the angle was then measured using a protractor mounted in the eyepiece. Images were obtained with a Canon Power Shot A75 digital camera affixed to the eyepiece. Contact angle measurement values can yield a qualitative determination of surface hydrophobicity.

Ellipsometry

Ellipsometry measurements were obtained with a Rudolph Series 439 manual null ellipsometer, e.g., a Manual Photoelectric Rudolf 439L633P ellipsometer (Rudolph Instruments, Fairfield, N.J., USA). Unpolarized light from a monochromatic He:Ne laser source with an incident wavelength of 632.8 nm was passed through a polarizer making it linearly polarized. The light then passed through a quarter wave retarder (compensator) making it elliptically polarized, and then onto the surface at an incident angle of 70 degrees. After reflecting off the surface the beam again becomes linearly polarized and is passed through another manually rotated polarizer to extinguish (null) the light. The null condition is determined by the detector reading. The polarizer values are recorded and used to calculate the film thickness using a DOS based program included with the ellipsometer.

Infrared Spectroscopy

Infrared Spectra were obtained using a Nexus FT-IR spectrometer equipped with a ThermoNicolet grazing angle accessory and a liquid nitrogen cooled mercury cadmium telluride A (MCTA) detector. The incident IR beam was at 75 degrees on the gold substrates. Prior to measurement the optical path was purged with a stream of nitrogen for 30 minutes, and purging was continued during the experiments. A clean, bare gold slide was used as the background, and a new background was collected immediately prior to each sample run. The scan range was from 4000 cm$^{-1}$ to 600 cm$^{-1}$, and 64 scans were collected for each sample. Attenuated total reflectance (ATR) infrared spectroscopy experiments were carried out on a Nexus FT-IR model 670 spectrometer using a liquid nitrogen cooled MCTA detector.

Fluorescence and Optical Microscopy

Patterned surfaces were examined by fluorescence microscopy. Fluorescent images were obtained in a Nikon Eclipse model E600 fluorescence microscope equipped with a Diagnostic Instruments RT Color digital camera and Spot (v. 4.0) analysis software. Samples were observed using a Nikon Plan Fluor 20x (N=0.50) Ph1 DLL lens. Illumination was provided by a mercury arc lamp (100 W, Chiu Technical Corporation) passed through a Nikon UV 2A filter cube with excitation filter wavelengths of 330-380 nm, a dichromatic mirror cut-on of 400 nm and barrier filter wavelengths cut-on at 420 nm. Samples were observed in a darkened room to avoid ambient light affecting the fluorescence. Optical microscopy was performed on a Fisher Micromaster optical microscope with an integrated digital camera coupled to a computer running Micron software.

Molecular Modeling

Molecular modeling was accomplished using Molecular Operating Environment (MOE) software from Chemical Computing Group (Montreal, Canada).

Surface Coverage

Surface coverage can be estimated by combining the results of ellipsometry and quartz crystal gravimetry, the latter can be carried out with a Maxtech RQCM quartz crystal microbalance.

Storage

The response of the film of this example is not expected to change if stored in a cool dark environment.

Example 1

Preparation of Materials (i) 2-nitrobenzyl 11-mercaptoundecanoate

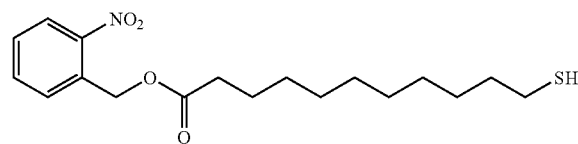

One equivalent of 2-nitrobenzyl alcohol (2.17 g, 14.15 mmol) was combined with one equivalent of 11-mercaptoundecanoic acid (3.09 g, 14.15 mmol), 0.1 equivalents DMAP (0.173 g, 1.42 mmol) and dissolved in 50 mL $CH_2Cl_2$. To this mixture a solution of DCC (2.92 g, 14.15 mmol) in 30 mL $CH_2Cl_2$ was slowly added while stirring. Upon addition a white precipitate formed after a few minutes. The mixture was stirred at room temperature overnight. Vacuum filtration removed the white precipitate and the filtrate was concentrated by rotovap. Silica gel column chromatography was employed for purification using $C_1H_2Cl_2$/MeOH (v/v 50:1) as the eluent. The product was dried over $Na_2SO_4$, the solvent removed by rotovap, and dried under vacuum thus producing a yellow solid. Yield: 3.57 g (71.4%). $^1$H-NMR ($CDCl_3$) δ (ppm): 8.1 (d, 1H, Ar), 7.6 (t, 1H, Ar), 7.5 (d, 1H, Ar), 7.4 (t, 1H, Ar), 5.5 (s, 2H, O—$CH_2$), 2.6 (t, 1H, SH) 2.5 (q, 2H, $CH_2$—SH), 2.4 (t, 2H, $CH_2$—C=O), 1.6 (m, 4H, $CH_2$), 1.2 (m, 12H, $CH_2$). $^{13}$C-NMR ($CDCl_3$) δ (ppm): 173.5, 147.0, 134.1, 132.7, 129.5, 129.2, 125.5, 63.2, 34.6, 34.4, 29.8, 29.7, 29.6, 29.5, 29.4, 28.8, 25.3, 25.1. MS (ESI): (M+Na)$^+$= 376.19 (calc. 376.47).

(ii) 1'-(2-nitrobenzyloxy)-1-oxoundecanoic acid

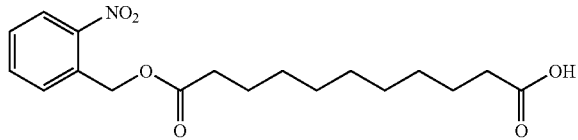

2-nitrobenzyl alcohol (0.708 g, 4.6 mmol), undecanedioic acid (1.0 g, 4.6 mmol), and DMAP (0.056 g, 0.46 mmol) were combined in a flask with 20 mL $CH_2Cl_2$. To this mixture a solution of DCC (0.954 g, 4.6 mmol) in 10 mL $CH_2Cl_2$ was slowly added. The reaction was stirred overnight at room temperature and a white precipitate formed. The precipitate was removed by vacuum filtration and the filtrate was concentrated by rotovap. Silica gel column chromatography with $CH_2Cl_2$/MeOH (v/v 50:1) as the eluent was used to purify the product. The product was dried over $Na_2SO_4$, solvent removed by rotovap, and dried under vacuum affording a white power. Yield: 0.488 g (30%). $^1$H-NMR ($CDCl_3$) δ (ppm): 11.1 (s, 1H, OH), 8.1 (d, 1H, Ar), 7.6 (d, 1H, Ar), 7.5 (t, 1H, Ar), 7.4 (t, 1H, Ar), 5.5 (s, 2H, O—$CH_2$), 2.3 (m, 4H, $CH_2$), 1.6 (m, 4H, $CH_2$), 1.2 (m, 10 H, $CH_2$). $^{13}$C NMR ($CDCl_3$) δ (ppm): 178.9, 173.5, 157.5, 134.0, 132.7, 129.4, 129.1, 125.4, 63.1, 34.5, 34.3, 34.1, 29.6, 29.5, 29.4, 25.9, 25.2, 25.1. MS (ESI): (M+Na)$^+$=374.23 (calc. 374.38).

(iii) 2-nitrobenzyl undec-10-enoate

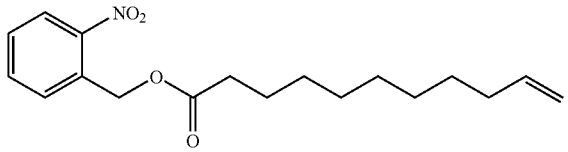

One equivalent of 2-nitrobenzyl alcohol (2.39 g, 15.65 mmol) was combined with one equivalent of undecylenic acid (2.88 g, 15.65 mmol) and 0.1 equivalents of DMAP and dissolved in 50 mL $CH_2Cl_2$. DCC (3.23 g, 15.65 mmol) was dissolved in 30 mL $CH_2Cl_2$ and slowly added to the mixture while stirring. A white precipitate slowly formed after about 5 minutes. The reaction mixture was stirred at room temperature overnight. The precipitate was filtered off by vacuum filtration and the filtrate was concentrated by rotovap. Silica gel column chromatography with $CH_2Cl_2$/MeOH (v/v 50:1) as eluent was used for purification. The product was dried over $Na_2SO_4$, solvent removed by rotovap, and dried under vacuum producing a yellow oil. Yield: 3.91 g (78.2%). $^1$H-NMR ($CDCl_3$) δ (ppm): 8.1 (d, 1H, Ar), 7.7 (t, 1H, Ar), 7.6 (d, 1H, Ar), 7.5 (t, 1H, Ar), 5.8 (m, 1H, CH=$CH_2$), 5.5 (s, 2H, $CH_2$—O) 4.9 (dd, 2H, $CH_2$=CH), 2.4 (t, 2H, $CH_2$—C=O), 2.0 (q, 2H, $CH_2$), 1.6 (m, 2H, $CH_2$), 1.2 (m, 10H, $CH_2$). $^{13}$C NMR ($CDCl_3$) δ (ppm): 173.5, 147.9, 139.5, 134.1, 132.7, 129.4, 129.1, 125.4, 114.6, 63.2, 34.5, 34.2, 29.7, 29.6, 29.5, 29.4, 29.3, 25.3. MS (ESI): (M+H)$^+$=320.30 (calc. 320.40).

(iv) 2-nitrobenzyl-(11-trichlorosilyl)-undecanoate

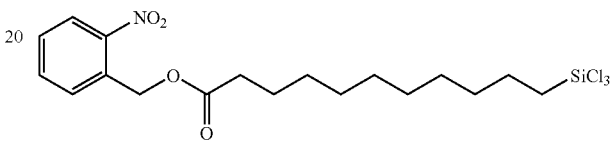

Previously prepared 2-nitrobenzyl undec-1,0-enoate (1.32 g, 4.14 mmol) was placed in a flask and excess trichlorosilane (8.36 mL, 82.8 mmol) was added under nitrogen protection. A 0.8 M solution of hydrogen hexachloroplatinate (IV) hydrate in 2-propanol was prepared and 60 μL of this solution was added to the reaction mixture while stirring. The mixture was stirred at room temperature overnight. The excess trichlorosilane was removed by vacuum, leaving a yellow oil. Yield: 1.40 g (74.5%). $^1$H-NMR ($CDCl_3$) δ (ppm): 8.1 (d, 1H, Ar), 7.7 (t, 1H, Ar), 7.6 (d, 1H, Ar), 7.5 (t, 1H, Ar), 5.5 (s, 2H, $CH_2$—O), 2.4 (t, 2H, $CH_2$—C=O), 1.6 (m, 4H, $CH_2$), 1.2 (m, 14H, $CH_2$). $^{13}$C NMR ($CDCl_3$) (ppm): 173.5, 147.9, 134.1, 132.7, 129.4, 129.1, 125.4, 63.2, 34.5, 32.2, 29.9, 29.7, 29.6, 29.5, 29.4, 29.3, 24.7, 22.6.

(v) Di-tert-butyl 5-hydroxyisophthatate

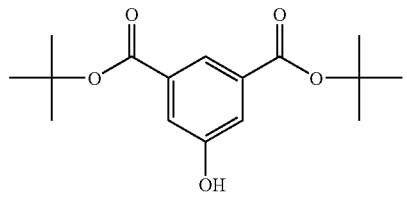

5-hydroxyisophthalic acid (5.0 g, 27.45 mmol) was combined with an excess of thionyl chloride (150 mL) and oxalyl chloride (5 mL) producing a white slurry. The mixture was heated to reflux for 18 hours, producing a clear yellow solution. The excess thionyl chloride was removed by vacuum leaving a viscous brown liquid which was dissolved in anhydrous THF (100 mL). This solution was slowly added to slurry of potassium tert-butoxide (9.0 g, 80.21 mmol) in anhydrous THF (100 mL). The addition caused the mixture to warm considerably. After the addition was complete the mixture was stirred at room temperature overnight. The solvent was removed by rotovap producing a sticky yellow-brown solid. The product was dissolved in ether and washed three times with saturated sodium bicarbonate. The organic layer was dried over $Na_2SO_4$, followed by rotovap, and dried under vacuum. An off-white solid was produced. Yield: 0.594 g (7.4%). $^1$H-NMR (CDCl$_3$) δ (ppm): 8.4 (s, 1H, Ar), 7.9 (s, 2H, Ar), 1.5 (s, 18H, CH$_3$). $^{13}$C-NMR (CDCl$_3$) δ (ppm): 164.4, 150.6, 134.3, 126.9, 119.5, 82.6, 28.5. MS: (ESI) (M)=293.0 (calc. 294.34).

(vi) 2-nitrobenzyl 11-bromoundecanoate

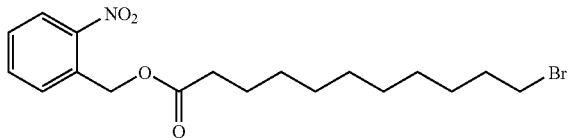

One equivalent of 2-nitrobenzyl alcohol (1.91 g, 12.49 mmol) was combined with one equivalent of 11-bromoundecanoic acid (3.31 g, 12.49 mmol), 0.1 equivalents DMAP (0.153 g, 1.25 mmol) and dissolved in 100 mL CH$_2$Cl$_2$. To this mixture a solution of DCC (2.58 g, 12.49 mmol) in 50 mL CH$_2$Cl$_2$ was slowly added while stirring. Upon addition a yellow-brown precipitate formed after a few minutes. The mixture was stirred at room temperature overnight. The precipitate was removed by vacuum filtration and the solvent was removed by rotovap. The product was purified using silica gel column chromatography with CH$_2$Cl$_2$/MeOH (v/v 50:1) as eluent. The product was dried over Na$_2$SO$_4$, the solvent removed by rotovap, and dried under vacuum, producing a white solid. Yield: 4.37 g (87.4%). $^1$H-NMR (CDCl$_3$) δ (ppm): 8.1 (d, 1H, Ar), 7.6 (t, 1H, Ar), 7.5 (d, 1H, Ar), 7.4 (t, 1H, Ar), 5.5 (s, 2H, O—CH$_2$), 3.4 (t, 2H, CH$_2$—Br), 2.4 (t, 2H, CH$_2$—C=O), 1.8 (m, 2H, CH$_2$), 1.6 (m, 2H, CH$_2$), 1.4 (m, 2H, CH$_2$), 1.3 (m, 10H, CH$_2$). $^{13}$C-NMR (CDCl$_3$) δ (ppm): 173.5, 147.9, 134.1, 132.7, 129.5, 129.2, 125.5, 63.2, 34.6, 34.5, 33.2, 29.7, 29.6, 29.5, 29.4, 29.1, 28.5, 25.3.

(vii) Di-tert-butyl 5-(11-(2-nitrobenzyloxy)-11-oxoundecvloxy)isophthalate

Previously prepared di-tert-butyl 5-hydroxyisophthalate (0.597 g, 2.03 mmol) and previously prepared 2-nitrobenzyl 11-bromoundecanoate (1.62 g, 4.06 mmol) were combined and dissolved in acetone (50 mL), producing a light yellow solution. Potassium carbonate (0.505 g, 3.65 mmol) was added and the mixture was heated to reflux for 40 hours. The mixture was filtered using vacuum filtration, and the solvent was removed from the filtrate by rotovap. The crude product was purified with silica gel column chromatography with CH$_2$Cl$_2$: hexanes (v/v 5:1) as eluent to afford the product as a yellow oil, which was dried by vacuum. Yield: 0.152 g (12.2%). $^1$H-NMR (CDCl$_3$) δ (ppm): 8.2 (s, 1H, Ar) 8.1 (d, 1H, Ar), 7.7 (s, 2H, Ar) 7.6 (t, 1H, Ar), 7.5 (d, 1H, Ar), 7.4 (t, 1H, Ar), 5.5 (s, 2H, O—CH$_2$), 4.0 (t, 2H, CH$_2$—O), 2.4 (t, 2H, CH$_2$—C=O), 1.8 (m, 2H, CH$_2$), 1.6 (m, 2H, CH$_2$), 1.6 (s, 18H, CH$_3$), 1.4 (m, 2H, CH$_2$), 1.3 (m, 10H, CH$_2$). $^{13}$C-NMR (CDCl$_3$) δ (ppm): 173.5, 165.4, 159.3, 147.9, 134.1, 133.7, 132.7, 129.4, 129.1, 125.4, 122.9, 119.5, 81.9, 68.8, 63.1, 34.5, 29.9, 29.8, 29.7, 29.6, 29.5, 29.4, 28.5, 26.3, 25.3.

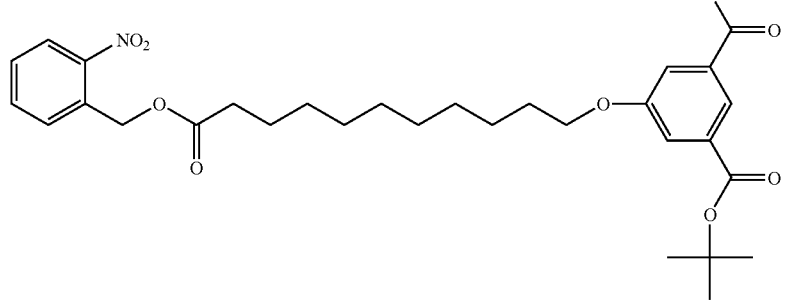

(viii) 5-(11-(2-nitrobenzyloxy)-11-oxoundecyloxy) isophthalic acid

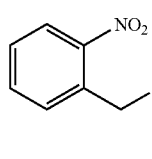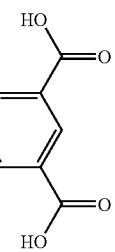

The previously prepared compound, di-tert-butyl 5-(11-(2-nitrobenzyloxy)-11-oxoundecyloxy)isophthalate, was dissolved in $CH_2Cl_2$ (10 mL) producing a yellow solution. Trifluoroacetic acid (TFA) (10 mL) was slowly added while stirring. The solution was stirred at room temperature for 1 hour. The solvent was removed by rotovap producing a white solid, which was washed four times with $CH_2Cl_2$ and dried under vacuum. A white power was produced. Yield: 0.127 g (100%). $^1$H-NMR (DMSO-$d_6$) δ (ppm): 13.3 (s, 2H, OH), 8.1 (d, 1H, Ar), 8.0 (s, 1H, Ar), 7.8 (t, 1H, Ar), 7.7 (d, 1H, Ar), 7.6 (t, 11H, Ar), 7.6 (s, 2H, Ar), 5.4 (s, 2H, O—$CH_2$), 4.0 (t, 2H, $CH_2$—O), 2.4 (t, 2H, $CH_2$—C=O), 1.7 (m, 2H, $CH_2$), 1.5 (m, 2H, $CH_2$), 1.4 (m, 2H, $CH_2$), 1.2 (m, 10H, $CH_2$). $^{13}$C-NMR (DMSO-$d_6$) δ (ppm): 172.8, 166.7, 159.1, 147.8, 134.4, 132.9, 131.8, 129.9, 129.7, 125.2, 122.4, 119.3, 68.4, 62.6, 33.6, 29.2, 29.1, 29.0, 28.9, 28.8, 28.7, 25.7, 24.7. MS (ESI): (M)=500.4 (calc. 501.53).

Example 2

Preparation of Substantially Monolayer Thick Film

Gold slides were purchased from Evaporated Metal Films (EMF; Ithaca, N.Y.). The slides have dimensions of 25 mm×75 mm×1 mm of float glass with cut edges, and are coated with 50 angstroms (Å) of a chromium adhesion layer followed by 1000 Å of Au. The substrates were cut into different sizes according to experimental needs. Prior to film formation, the substrates were cut to desired size and immersed in piranha solution (70% sulfuric acid, 30% hydrogen peroxide (30% aqueous)) at 90° C. for 10 minutes to clean the surface. The slides were then washed with distilled water, washed with absolute ethanol, dried with nitrogen, and used immediately. Monolayers and other organic ligand layers were prepared by immersing the clean gold slides in a 5 mM ethanol solution of the desired compound overnight to insure full surface coverage of the monolayer. Metal layers are deposited from 2 mM solutions of the desired metal salt in ethanol for 2 hours. For example, a 2 mM lead (IV) acetate solution in ethanol was used as a source of Pb (IV) ions. Subsequent capping layers were also 5 mM in ethanol. After each layer deposition, the films were rinsed with ethanol and dried with nitrogen.

Example 3

Photo-Deprotection of Monolayers and Imagewise Patterning

Figure 11A:
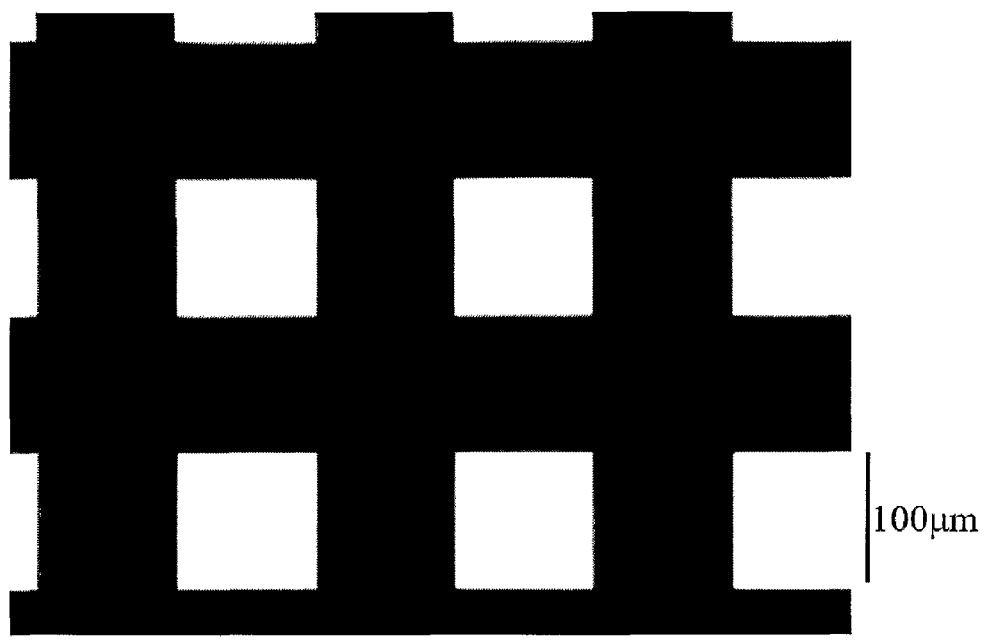
FIG. 11A depicts a portion of the photomask used in the Examples.

Custom fabricated photomasks were obtained from Adtek Photomask (Montreal, Canada). The specified design and dimensions were printed on soda lime glass (3"×3"×0.06") using a chrome coating. Irradiation through the mask was accomplished by placing the mask directly on top of the gold slides in a Petri dish along with the acid solution. The masks were rinsed thoroughly with distilled water and ethanol after each use. An example of the photomask used, having about 100 μm squares, is shown in FIG. 11A.

Removal of the photo-labile protecting group was accomplished by exposing the slides to UV light in a Rayonet reactor. The lamp used was a mercury arc lamp with a maximum distribution of light centered at 300 nm. In some cases, the slides were placed in a 0.1 M HCl solution in Pyrex beakers and irradiated for 90-120 minutes. Longer irradiation times showed no increased effect on the removal of the protecting group. In other cases, the slides were placed in deionized water and irradiated for 2 hours. For photomask experiments the irradiation was accomplished from above, through the solution, with no filter. The photomask was tightly clamped to the substrate to limit the effect of diffraction. No solvent was used for photomask experiments Successful SAM formation and photo-deprotection was confirmed by contact angle, grazing incidence IR, and electrochemical measurements. SAMs of 2-nitrobenzyl 11-mercaptoundecanoate produced a sessile water (pH 12) droplet contact angle of 72°±2°, which is expected of the hydrophobic terminal nitrobenzyl moiety. After irradiation and removal of the protecting group, the contact angle of the surface decreases to 16°±3°, consistent with an acid terminus on the surface.

Figure 14A:
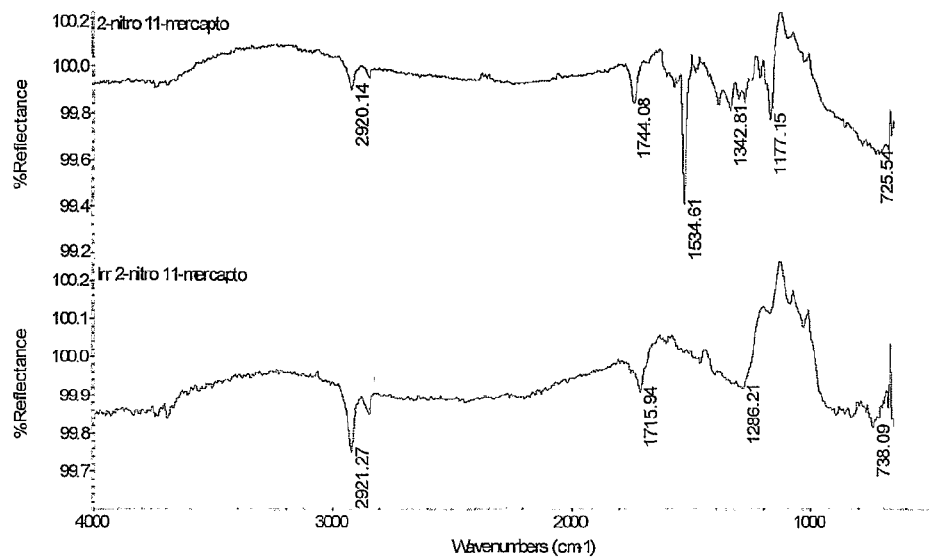
FIG. 14A depicts two grazing incidence IR spectra of exemplary protected and deprotected monolayers of the present invention.

Grazing incidence infrared spectra of the protected (top) and deprotected (bottom) monolayer are shown in FIG. 14A. The most noticeable indication of successful irradiation and removal of the protecting group is the strong signal at 1534 $cm^{-1}$, which is consistent with a nitro group. As shown in the spectrum, this signal is non-existent after irradiation, indicating that the o-nitrobenzyl group has been cleaved as expected. Also, the carbonyl stretching frequency shifts from 1744 $cm^{-1}$ to 1715 $cm^{-1}$ after irradiation which is consistent with the original ester being converted to a carboxylic acid.

Figure 14B:
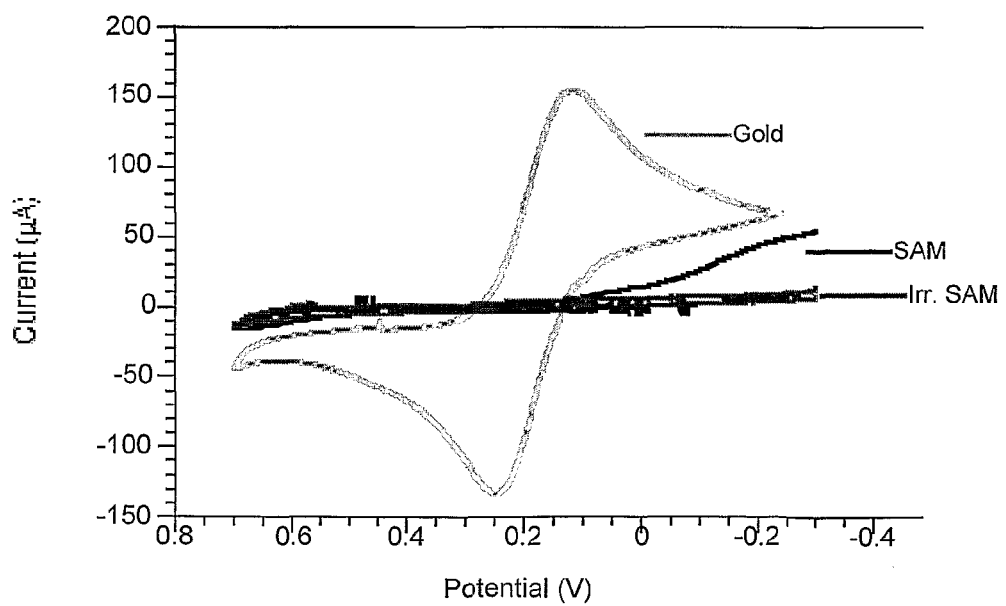
FIG. 14B depicts cyclic voltammograms of exemplary protected and deprotected monolayers of the present invention.

Cyclic voltammograms of the protected and deprotected monolayers are shown in FIG. 14B, along with a bare gold surface for comparison. When the bare gold surface is used as the working electrode the expected redox of the ferricyanide in solution is readily observed. After SAM deposition the monolayer blocks electron penetration to the surface and the characteristic anodic and cathodic redox peaks of ferricyanide are no longer seen. The blocking voltammogram is indicative of well ordered monolayer formation on the surface. Following irradiation the surface remains blocking, indicating the exposure to ultraviolet light had not destroyed or removed the monolayer.

Imagewise Patterning

Figure 11B:
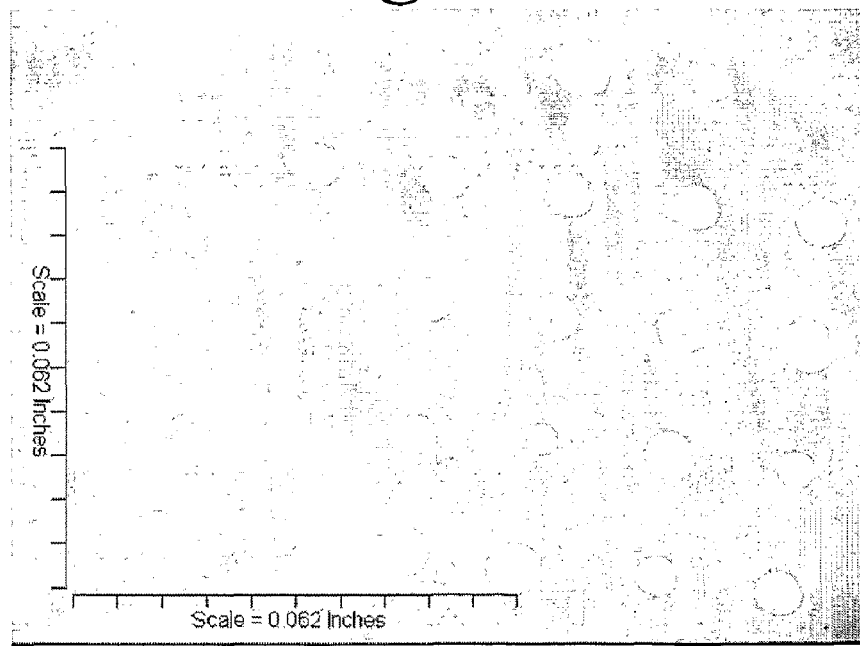
FIG. 11B depicts an optical micrograph of ethanol droplets on an exemplary patterned surface of the present invention.

Gold slides coated with a SMF of photo-labile molecules, 2-nitrobenzyl 11-mercaptoundecanoate molecules, were prepared substantially as described above in the "Preparation of substantially monolayer thick film" section. The molecules were irradiated in the presence of the photomask depicted in FIG. 11A substantially as described above in the "Photo-deprotection of monolayers" section, except using a 350 nm Rayonet lamp. Upon rinsing and drying the film immediately after irradiation, a pattern of droplets of ethanol could clearly be observed due to the areas of significantly different wettability on the surface. An image of the ethanol droplets on the surface was obtained by placing a drop of ethanol on the slide, and then using a stream of nitrogen to remove most of the ethanol, revealing the pattern. An optical micrograph of ethanol droplets on a patterned surface is shown in FIG. 11B.

The entire surface of the slides were then contacted with a 2 mM lead (IV) acetate solution for 2 hours, followed by a 5 mM solution of an organic pyrene containing ligand (5-(pyren-1-ylmethoxy)isophthalic acid) for 48 hours. The compound, 5-(pyren-1-ylmethoxy)isophthalic acid:

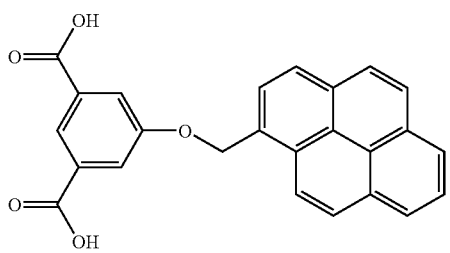

was chosen because the isophthalic acid portion of this compound provides a metal ion binding site, and the pyrene portion can be observed by fluorescence microscopy.

Figure 12A:
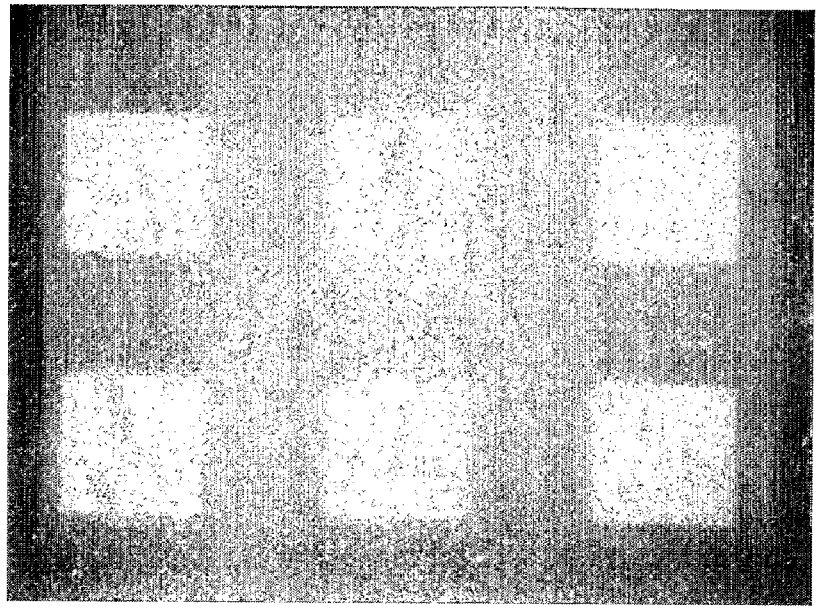
FIGS. 12A-12B depict fluorescence microscopic images of glass slides that have been at least partially coated with a photo-labile molecule and irradiated using the photomask depicted in FIG. 11.
Figure 12B:
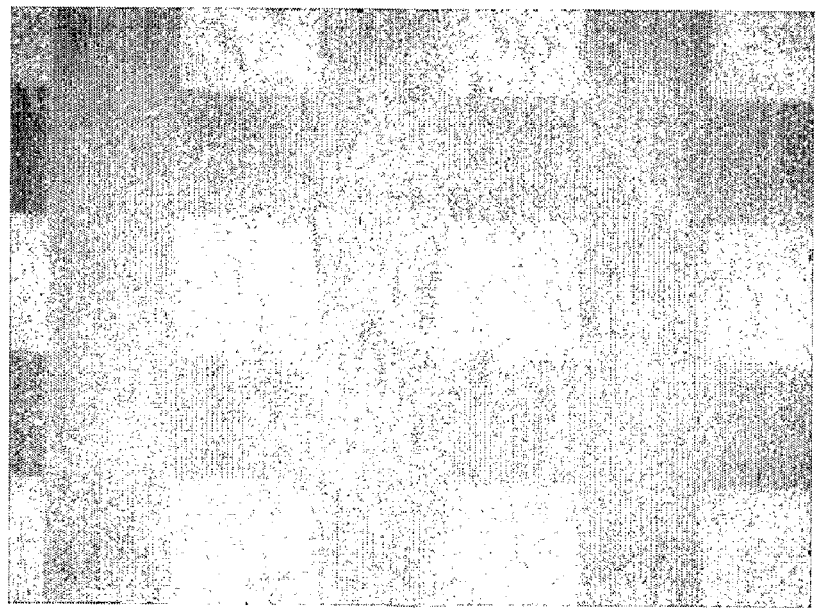

Referring to FIGS. 12A and 12B, fluorescence microscopic images of the resulting slides show that the pyrene remains in the portions exposed to irradiation. In the areas exposed to light, there is substantial fluorescence intensity originating from the pyrene group. Without wishing to be bound by any particular theory, it is believed that this observation is due to the photo-deprotection in those areas exposed to light, which generates a carboxylate group; the complexation of Pb(IV) ions only to the carboxylate groups in areas that were exposed to light; and the complexation of the pyrene containing compound by the Pb(IV) ions already complexed to the surface.

Several control experiments were performed including observing the irradiated monolayer alone through the mask, observing samples with no metal present, and observing the surface without using the photomask. In all of these control experiments, no pattern was observed. These results indicate that the multi-layered film is assembled as previously described, in the alternating organic ligand, metal ion formation, and that these films can be layered in selective patterns.

Figure 13A:
FIGS. 13A-13B depict fluorescence microscopic images of the glass slides of FIGS. 12A and 12B which have been rotated by 45 degrees in relation to the photomask and irradiated a second time.
Figure 13B:
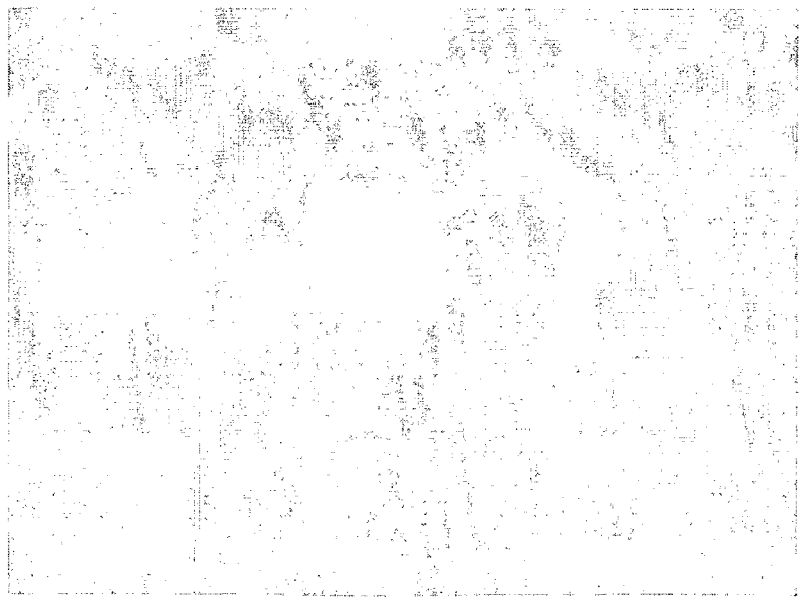

The slides were then rotated 45 degrees with respect to the photomask, and irradiated in the presence of the photomask a second time substantially as described above in the "Photo-deprotection of monolayers" section. The slides were then contacted with a 2 mM lead (IV) acetate solution for 2 hours, followed by a 5 mM pyrene solution for 48 hours. Referring to FIGS. 13A and 13B, fluorescence microscopic images of the resulting slides show the new pattern superimposed on the original pattern, and that the pyrene remains in the portions that were exposed to irradiation in both the first and the second photo-deprotection steps, but is substantially missing from all other portions of the slide. Additionally, the images indicate that the pyrene containing molecules and the underlying metal and organic layers are stable to further irradiation.

All literature and similar material cited in this application, including, patents, patent applications, articles, books, treatises, and web pages, regardless of the format of such literature and similar materials, are expressly incorporated by reference in their entirety. In the event that one or more of the incorporated literature and similar materials differs from or contradicts this application, including defined terms, term usage, described techniques, or the like, this application controls.

The section headings used herein are for organizational purposes only and are not to be construed as limiting the subject matter described in any way.

While the present inventions have been described in conjunction with various embodiments and examples, it is not intended that the present teachings be limited to such embodiments or examples. On the contrary, the present inventions encompass various alternatives, modifications, and equivalents, as will be appreciated by those of skill in the art.

The claims should not be read as limited to the described order or elements unless stated to that effect. It should be understood that various changes in form and detail may be made without departing from the scope of the appended claims. By way of example, any of the disclosed features can be combined with any of the other disclosed features to provide a methods and devices in accordance with the present inventions. For example, any of the various disclosed embodiments of a molecule having a photo-labile group can be combined with one or more metal ions and one or more photovoltaic, photochromic, and/or analyte sensing molecules to provide a nanopatterned device in accordance with one or more embodiments of the present inventions. Therefore, all embodiments that come within the scope and spirit of the following claims and equivalents thereto are claimed.

What is claimed is:

1. A method for imagewise patterning of a surface comprising:
   (a) forming a first substantially monolayer thick film on at least a portion of the surface, the first substantially monolayer thick film comprising a photo-labile molecule responsive to a first wavelength of light;
   (b) imagewise exposing at least a portion of the first substantially monolayer thick film to the first wavelength of light, such that a first irradiated portion is formed;
   (c) contacting at least a portion of the first irradiated portion with a first metal ion, such that a first metallic layer is formed;
   (d) forming a second substantially monolayer thick film on at least a portion of the first metallic layer, the second substantially monolayer thick film comprising a photo-labile molecule responsive to a second wavelength of light;
   (e) imagewise exposing at least a portion of one or more of the first and second substantially monolayer thick films with the second wavelength of light, such that a second irradiated portion is formed;
   (f) contacting at least a portion of the second irradiated portion with a second metal ion, such that a second metallic layer is formed; and
   (g) forming a cap layer on at least a portion of the second metallic layer by contacting at least a portion of the second metallic layer with a compound selected from the group consisting of: a photovoltaic molecule, a photochromic molecule, an analyte sensing molecule, and a capping molecule, wherein steps (d), (e), and (f) are repeated one or more times prior to step (g).

2. The method of claim 1, wherein the photo-labile molecule responsive to the first wavelength of light or the photo-labile molecule responsive to the second wavelength of light comprises at least one molecule selected from molecules comprising ortho-nitrobenzyl photolinkers and molecules comprising dithiane protected benzoin photolinkers.

3. The method of claim 1, wherein the photo-labile molecule responsive to the first wavelength of light or the photo-labile molecule responsive to the second wavelength of light comprises at least one molecule selected from 2-nitrobenzyl-11-mercaptoundecanoate, 2-nitrobenzyl-11-(trichlorosilyl) undecanoate, 2-nitrobenzyl undec-10-enoate, 11-(2-nitrobenzyloxy)-11-undecanoic acid, 2-nitrobenzyl 11-bromoundecanoate, di-tert-butyl 5-(11-(2-nitrobenzyloxy)-11-oxoundecyloxy)isophthalate, and 5-(11-(2-nitrobenzyloxy)-11-oxoundecyloxy)isophthalic acid.

4. The method of claim 1, wherein the first wavelength of light and the second wavelength of light are substantially the same.

5. The method of claim 1, wherein the first metal ion and the second metal ion are the same.

6. The method of claim 1, wherein the first metal ion and the second metal ion each independently comprise at least one metal ion selected from Cu(II), Co(II), Fe(III), Pb(II), and Pb(IV).

7. The method of claim 1, where at least a portion of the cap layer comprises at least one molecule selected from a photochromic molecule, a photovoltaic molecule, and an analyte sensing molecule.

8. The method of claim 7, wherein the photochromic molecule comprises at least one molecule selected from substituted or unsubstituted spiropyran molecules, substituted or unsubstituted spirooxazine molecules, dipyridyl containing molecules, 2,2'-dipyridylethylene, substituted or unsubstituted chromene molecules, substituted or unsubstituted spirodihydroindolizine molecules, and substituted diazine molecules.

9. The method of claim 7, wherein the photovoltaic molecule comprises at least one molecule selected from chromophores, pyridine, pyrene, perylene, naphthaline, anthracene, or other fused aromatics, porphyrins, substituted porphyrins, dicarboxypyridine-substituted tetraphenylporphyrin, mono-, di-, tri-, tetraphenyl porphyrins, benzoporphyrins, mono-, di-, tri-, tetraphenylbenzoporphyrins and/or phthalocyanines, photooxidants, Rhodamine dyes, methyl viologen, substituted methylviologens, quinones, substituted quinines, photoreductants, EDTA, tertiary and secondary amines, and aromatics containing alkoxy groups.

10. The method of claim 7, wherein the analyte sensing molecule comprises a fluorophore component and an ionophore component.

11. The method of claim 10, wherein the ionophore comprises at least one ionophore selected from a crown ether and an aza crown calixarene.

12. The method of claim 10, wherein the fluorophore portion comprises at least one fluorophore selected from anthracene, 4,4-difluoro-4-boro-3a,4a-diaza-s-indacene, tetramethylrosamine, aminohodamine B, N-methyl-4-hydrazino-7-nitrobenzofuran, nicotinamide adenine dinucleotide (NAD), reduced NDA (NADH) and NAD phosphate (NADP).

* * * * *